United States Patent
Nagase et al.

(10) Patent No.: US 6,483,185 B1
(45) Date of Patent: Nov. 19, 2002

(54) POWER MODULE SUBSTRATE, METHOD OF PRODUCING THE SAME, AND SEMICONDUCTOR DEVICE INCLUDING THE SUBSTRATE

(75) Inventors: Toshiyuki Nagase, Omiya (JP); Yoshiyuki Nagatomo, Omiya (JP); Kazuaki Kubo, Omiya (JP); Shoichi Shimamura, Omiya (JP); Koichi Goshi, Omiya (JP)

(73) Assignee: Mitsubishi Materials Corporation, Tokyo (JP)

( * ) Notice: Subject to any disclaimer, the term of this patent is extended or adjusted under 35 U.S.C. 154(b) by 0 days.

(21) Appl. No.: 09/401,410

(22) Filed: Sep. 22, 1999

(30) Foreign Application Priority Data

| Sep. 22, 1998 | (JP) | 10-267712 |
| Sep. 22, 1998 | (JP) | 10-267713 |
| Dec. 11, 1998 | (JP) | 10-352797 |
| Feb. 8, 1999 | (JP) | 11-029551 |
| May 19, 1999 | (JP) | 11-138662 |
| Aug. 23, 1999 | (JP) | 11-235059 |

(51) Int. Cl.[7] .............................................. H01L 23/48
(52) U.S. Cl. ...................................... 257/706; 257/714
(58) Field of Search ................................ 257/706, 707, 257/712, 714, 715, 716, 717, 718, 719; 174/252; 361/688, 689

(56) References Cited

U.S. PATENT DOCUMENTS

| 4,279,292 A | * | 7/1981 | Swiatosz ..................... 165/61 |
| 4,326,843 A | * | 4/1982 | Smith ........................ 431/264 |
| 4,612,978 A | * | 9/1986 | Cutchaw ................. 165/104.33 |
| 4,758,927 A | * | 7/1988 | Berg .......................... 361/401 |
| 5,130,498 A | | 7/1992 | Yoshida et al. |
| 5,213,877 A | | 5/1993 | Yoshida et al. |
| 5,451,279 A | | 9/1995 | Kohinata et al. |
| 5,473,510 A | * | 12/1995 | Dozier, II ................... 361/719 |
| 5,675,474 A | | 10/1997 | Nagase et al. |
| 5,926,371 A | * | 7/1999 | Dolbear ...................... 361/704 |
| 5,959,840 A | * | 9/1999 | Collins et al. .............. 361/713 |

* cited by examiner

Primary Examiner—Jerome Jackson
Assistant Examiner—Lourdes Cruz
(74) Attorney, Agent, or Firm—Oblon, Spivak, McClelland, Maier & Neustadt, P.C.

(57) ABSTRACT

A power module substrate includes a ceramic substrate having a circuit pattern formed thereon, and a metal frame with which the ceramic substrate can be joined to a water-cooling type heat sink. The metal frame has a thickness equal to that of the ceramic substrate or the ceramic substrate having the circuit pattern, and is provided with plural perforations formed therein. Metal thin sheets having through-holes in communication with the corresponding perforations, and containing contacting portions having the undersides thereof contacted to at least a part of the circumferential surface of the ceramic substrate are disposed on the surface of the metal frame. In a semiconductor device, a semiconductor element is mounted onto the circuit pattern, and the power module substrate is joined directly to the water-cooling type heat sink by inserting male screws through the through-holes and the perforations, and screwing the male screws in the female screws of the water-cooling type heat sink.

9 Claims, 15 Drawing Sheets

POWER MODULE SUBSTRATE, METHOD OF PRODUCING THE SAME, AND SEMICONDUCTOR DEVICE INCLUDING THE SUBSTRATE

BACKGROUND OF THE INVENTION

1. Field of the Invention

The present invention relates to a power module substrate for use in a power module which dissipates heat, a method of producing the same, and a semiconductor device including the substrate, and more particularly to a power module substrate which is so structured as to be joined directly to a water-cooling type heat sink by means of male screws, a method of producing the same, and a semiconductor device including the substrate.

2. Discussion of the Background

As a power module substrate of the above type, as shown in FIG. 22, known is a substrate in which a ceramic substrate 1 is made of AlN, and to the opposite sides of the ceramic substrate 1, first and second copper plates 2 and 3 are laminated and bonded, and an Ni plating is formed on the upper side of a heat sink 4 made of Cu, and further, the heat sink 4 is laminated and bonded to the second copper sheet 3 through a solder 6. In the case of a semiconductor device having a semiconductor element 7 mounted onto this substrate, the heating quantity is relatively large. Accordingly, the semiconductor device is joined to a water-cooling type heat sink 8 which transfers the heat outside forcedly by circulating cooling water 8a inside thereof. The attachment of the power module substrate to the water-cooling type heat sink 8 is carried out by forming attachment holes 4a in the heat sink 4, and pushing male screws 9 through the attachment holes 4a and screwing the male screws in female screws 8b formed in the water-cooling type heat sink 8. In the semiconductor device joined as described above, heat emitted from the semiconductor element and so forth is dissipated outside from the water-cooling type heat sink 8 through the first copper sheet 2, the ceramic substrate 1, the second copper sheet 3, the solder 6, and the heat sink 4.

However, in the above-described conventional semiconductor device, the heat transfer route from the semiconductor element 7 or the like to the water-cooling type heat sink 8 is relatively long. In particular, inconveniently, heat from the semiconductor element 7 can not be efficiently transferred to the water-cooling type heat sink 8, since the second copper sheet 3 is laminated and bonded to the water-cooling type heat sink 8 through the solder 6 having a low thermal conductivity. To solve this problem, it may be proposed that attachment holes 1a are formed directly in the ceramic substrate 1 without the heat sink being provided, the male screws 9 are inserted through the attachment holes 1a, and screwed in the female screw 8b formed in the water-cooling type heat sink 8, as shown in FIG. 21, so that the heat transfer route from the semiconductor element to the water-cooling type heat sink 8 is shortened.

However, there is the problem that it is very difficult to form the attachment holes 1a after the ceramic substrate is fired, since the substrate 1 after firing is rigid and brittle. Further, as regards forming the attachment holes 1a before firing, and then, firing the ceramic substrate 1, there is the problem that the pitch of the attachment holes 1a can not be exactly produced due to the shrinkage at firing. Even if the attachment holes 1a can be accurately formed, there is the danger that the ceramic substrate 1, which is brittle, may be cracked, caused by the tightening force of the male screws 9 generated when the ceramic substrate 1 is joined to the water-cooling type heat sink 8.

SUMMARY OF THE INVENTION

Accordingly, it is an object of the present invention to provide a power module substrate in which the heat transfer route from a semiconductor element to a water-cooling type heat sink is shortened, and thereby, heat from the semiconductor element can be effectively dissipated without the ceramic substrate being damaged, a method of producing the same, and a semiconductor device including the substrate.

According to the present invention, as shown in FIGS. 1 and 6, there is provided a power module substrate which comprises a ceramic substrate 11 having a circuit pattern 17 formed on the surface thereof, and a metal frame 12 provided on the periphery of the ceramic substrate 11 and so structured that the ceramic substrate 11 can be joined to a water-cooling type heat sink 27.

In this power module substrate, the ceramic substrate 11 is joined to the water-cooling type heat sink 27 through the metal frame 12. Therefore, no external force is applied directly to the ceramic substrate 11, and breaking of the ceramic substrate 11, caused by the joining, is prevented. Heat from the semiconductor device mounted onto the circuit pattern 17 can be effectively transferred to the water-cooling type heat sink 27 and dissipated.

Preferably, the ceramic substrate 11 is formed with AlN, $Si_3N_4$, or $Al_2O_3$. When AlN is used as the ceramic substrate 11, the thermal conductivity and the heat resistance are enhanced. The use of $Si_3N_4$ improves the strength and the heat resistance. With the use of $Al_2O_3$, the heat resistance is enhanced.

Preferably, in the above power module substrate, the metal frame 12 has a thickness equal to that of the ceramic substrate 11 or the ceramic substrate 11 having the circuit pattern 17, and is provided with plural perforations 12a formed so as to sandwich the ceramic substrate 11, and metal thin sheets 13 having through-holes 13a in communication with the corresponding perforations 12a, and containing contacting portions 13b having the undersides thereof contacted to at least a part of the circumferential surface of the ceramic substrate 11 or the circuit pattern 17 are disposed on the surface of the metal frame 12, whereby the ceramic substrate 11 having the circuit pattern 17 formed thereon and contacted to the undersides of the contacting portions 13b can be joined into the water-cooling type heat sink 27 by inserting male screws 26 through the through-holes 13a and the perforations 12a, and screwing the male screws 26 in female screws 27a formed in the water-cooling type heat sink 27 or further inserting the male screws 26 through attachment holes 27c formed so as to perforate the water-cooling type heat sink 27 and screwing the male screws in nuts 31.

As described above, the perforations 12a and the through-holes 13a are formed in the metal frame 12 and the metal thin sheets 13 bonded to the surface of the metal frame 12, correspondingly. Accordingly, when the male screws 26 are inserted through the through-holes 13a and the perforations 12a, and screwed in the female screws 27a (FIG. 2C) formed in the water-cooling type heat sink 27, or further inserted through the attachment holes 27c formed so as to perforate the water-cooling type heat sink 27 and screwed in nuts 31 (FIG. 6), the tightening force of the male screws 26 is not applied directly to the ceramic substrate 11, preventing the breaking of the ceramic substrate 11, which may be caused by the tightening force of the male screws 26. Heat from a semiconductor element mounted onto the circuit pattern 17 can be effectively transferred to the water-cooling type heat sink 27 and dissipated.

In the case that the metal frame 12 and the metal thin sheets 13, disposed on the surface of the metal frame 12, are made of a material which can be machined relatively easily as compared with the ceramic substrate 11, and the through-holes 13a and the perforations 12a are formed in the metal thin sheets 13 and the metal frame 12, correspondingly, so as to perforate them, attachment holes can be formed in the power module substrate easily and at a high precision attachment pitch.

Also preferably, as shown in FIG. 8, a metal frame 62 has a thickness greater than that of the ceramic substrate 11 or the ceramic substrate 11 having the circuit pattern 17, and is provided with plural perforations 62a formed so as to sandwich the ceramic substrate 11, metal thin sheets 63 having through-holes 63a in communication with the corresponding perforations 62a, containing opposing portions 63b having the undersides thereof opposed to at least a part of the circumferential surface of the ceramic substrate 11 or the circuit pattern 17 is disposed on the surface of the metal frame 62, and elastic pieces 64 each having a thickness equal to the difference between the ceramic substrate 11 or the ceramic substrate 11 having the circuit pattern 17 and the metal frame 62 or being slightly larger than the difference are interposed between the surface of the ceramic substrate 11 or the circuit pattern 17 and the opposing portions 63b, respectively, whereby the ceramic substrate 11 having the circuit pattern 17 formed thereon and contacted to the undersides of the opposing portions 63b through the elastic pieces 64 can be joined to the water-cooling type heat sink 27 by inserting male screws through the through-holes 63a and the perforations 62a and screwing the male screws 26 in the female screws 27a formed in the water-cooling type heat sink 27, or further inserting the male screws 26 through the attachment holes 27c formed in the water-cooling type heat sink 27 and screwing the male screws 26 in the nuts 31, respectively.

In the above power module substrate, breaking of the ceramic substrate 11, caused by the tightening force of the male screws 26, is prevented. Heat from the semiconductor element 23 mounted onto the circuit pattern 17 can be effectively transferred to the water-cooling type heat sink 27, and moreover, the elastic pieces 64 interposed between the surface of the ceramic substrate 11 or the circuit pattern 17 and the opposing portions 63b, respectively, absorb the attachment error between the ceramic substrate 11 and the water-cooling type heat sink 27, caused by the expansion or shrinkage. Thus, breaking of the ceramic substrate 11, caused by the change of temperature, is prevented.

More preferably, in the power module substrate, both of the upper side and the underside of each elastic piece 64 are bonded to the surface of the ceramic substrate 11 or the circuit pattern 17 and the surface of the corresponding opposing portion 63b through a heat resistant adhesive 66, respectively.

In this power module substrate, since the elastic piece 64 is interposed and bonded between the surface of the ceramic substrate 11 or the circuit pattern 17 and the corresponding opposing portion 63b, the substrate is prevented from being displaced in its use environment, which may be caused by vibration or the like, so that the ceramic substrate 11, which has the circuit pattern 17 in contact to the undersides of the opposing portions 63b through the elastic pieces 64, can be effectively bonded to the water-cooling type heat sink 27.

More preferably, in the power module substrate of the present invention, each of the elastic pieces 64 has a rectangular cross-section, and the ratio Y/X is at least 0.08 in which X represents the width of the cross-section and Y the thickness of the elastic piece 64.

Preferably, in the power module substrate of the present invention, the ceramic substrate 11 has a metal foil 11a bonded to the back thereof, and the bearing pressure P of the metal foil 11a through which the ceramic substrate 11 is bonded to the water-cooling type heat sink 27, against the water-cooling type heat sink 27, and the coefficient $\mu$ of friction between the metal foil 11a and the water-cooling type heat sink 27 has a relationship expressed as the formula of $\mu P \leq 10$ (MPa).

Accordingly, the displacement in the horizontal direction of the ceramic substrate 11, caused by the thermal expansion, is enabled, and breaking of the ceramic substrate 11 is prevented.

Preferably, in the power module substrate of the present invention, as shown in FIGS. 9 and 13, the metal frame 72 is provided on at least a part of the periphery of the ceramic substrate 11, has a thickness equal to or slightly smaller than that of the ceramic substrate 11, and has plural perforations 72a formed so as to sandwich the ceramic substrate 11, a first metal thin sheet 73 having first through-holes 73a in communication with the corresponding perforations 72a, having a circuit pattern 77 formed in the part of the first metal thin sheet 73 opposed to the ceramic substrate 11 is bonded to the surface of the ceramic substrate 11 and that of the metal frame 72 through a soldering material 76, and a second metal thin sheet 74 having second through-holes 74a in communication with the perforations 72a and the first through-holes 73a, respectively, and opposed to the water-cooling type heat sink 27 is bonded to the back of the ceramic substrate 11 and that of the metal frame 72 through the soldering material 76, whereby the ceramic substrate 11 can be joined to the water-cooling type heat sink 27 by inserting the male screws 26 through the first through-holes 73a, the perforations 72a, and the second through-holes 74a, screwing the male screws 26 in the female screws 27a formed in the water-cooling type heat sink 27 or further inserting the male screws 26 through the attachment holes 27c formed in the water-cooling type heat sink 27 and screwing the male screws 26 in the nuts 31.

In the above-described power module substrate, the first through-holes 73a, the perforations 72a, and the second through-holes 74a are formed in the metal frame 72 integrated with the ceramic substrate 11, and the first and second metal thin sheets 73 and 74 bonded to the front and the back of the metal frame 72, correspondingly. Accordingly, when the male screws 26 are inserted through the first through-holes 73a, the perforations 72a, and the second through-holes 74a, screwed in the female screws 27a formed in the water-cooling type heat sink 27 or further inserted through the attachment holes 27c formed in the water-cooling type heat sink 27 and screwed in the nuts 31, no tightening force of the male screws 26 is applied directly to the ceramic substrate 11, which prevents breaking of the ceramic substrate 11, caused by the tightening force of the male screws 26. Heat from the semiconductor element 23 mounted onto the circuit pattern 77 can be effectively transferred to the water-cooling type heat sink 27.

Also more preferably, in the power module substrate of the present invention, as shown in FIGS. 14 and 19, the metal frame 112 is secured to at least a part of the periphery of the ceramic substrate 111, and has plural perforations 112a formed so as to sandwich the ceramic substrate 111, collars 116 each comprising a cylindrical portion 116a having a through-hole 116c and a flange 116b in contact to the upper side of the metal frame 112, which are formed integrally with each other, are floating-inserted through the perforations 112a, respectively, elastic pieces 117 are interposed between the flange portions 116b and the upper side of the metal frame 112, respectively, and whereby the ceramic substrate 111 having the metal frame 112 secured thereto can be joined to the water-cooling type heat sink 27 by inserting the male screws 26 through the perforations 116c, screwing the male screws 26 in the female screws 27a formed in the water-cooling type heat sink 27 or further inserting the male screws 26 through the attachment holes 27c formed in the water-cooling type heat sink 27 and screwing the male screws 26 in the nuts 31.

More preferably, as shown in FIG. 16, in the power module substrate of the present invention, the metal frame 112 is secured to at least a part of the periphery of the ceramic substrate 111, and has the plural insertion holes 112a formed so as to sandwich the ceramic substrate 111, washers 118 having communication holes 118a in communication with the corresponding insertion holes 112b are disposed on the upper side of the metal frame 112, and the elastic pieces 117 are interposed between the washers 118 and the upper side of the metal frame 112, respectively, whereby the ceramic substrate 111 having the metal frame 112 secured thereto can be joined to the water-cooling type heat sink 27 by floating-inserting the male screws 26, inserted through the communication holes 118a, through the insertion holes 112b, screwing the male screws 26 in the female screws 27a formed in the water-cooling type heat sink 27 or further inserting the male screws 26 through the attachment holes 27c formed in the water-cooling type heat sink 27 and screwing the male screws 26 in the nuts 31.

As seen in the above description, the perforations 112a and the insertion holes 112b, as they are formed in the metal frame 112 secured to the ceramic substrate 111, can be formed easily and at a high precision pitch as compared with the case where the attachment holes 1a are formed directly in the ceramic substrate 1 as shown in FIG. 21.

Further, when the ceramic substrate 11 is joined to the water-cooling type heat sink 27 with the male screws 26 and by use of the perforations 112a and the insertion holes 112b, the tightening force of the male screws 26 is not applied directly to the ceramic substrate 111, preventing the breaking of the ceramic substrate 111, caused by the tightening force of the male screws 26. Heat from the semiconductor element 23 mounted onto the circuit pattern 111a can be effectively transferred to the water-cooling type heat sink 27.

Moreover, the elastic pieces 117 interposed between the collars 116 or the washers 118 and the upper side of the metal frame 112, respectively, absorb the attachment error between the ceramic substrate 111 and the water-cooling type heat sink 27, caused by the expansion or shrinkage, which is contributed by the elasticity. Thus, breaking of the ceramic substrate 111, caused by the change of temperature, is prevented.

More preferably, in the power module substrate of the present invention, the metal frame 112 is secured to the ceramic substrate 111 at least partially by soldering or welding.

By soldering or welding as described above, the metal frame 112 can be secured to the ceramic substrate 111 easily and steadily.

Still more preferably, in the power module substrate of the present invention, the ceramic substrate 11 has a thickness of from 0.2 mm to 3.5 mm.

If the thickness of the ceramic substrate 11 is less than 0.2 mm, the ceramic substrate 11, which is joined to the water-cooling type heat sink 27 through the metal frame by screwing of the male screws 26, may be broken, caused by the tightening force of the male screws 26. If the thickness of the ceramic substrate 11 exceeds 3.5 mm, the mechanical strength of the ceramic substrate 11 itself is so high that it can be joined directly to the water-cooling type heat sink 27 with the male screws 26.

According to the present invention, as shown in FIG. 9, there is provided a method of producing the power module substrate which comprises the steps of providing the metal frame 72 having a thickness equal to or slightly smaller than that of the ceramic substrate 11 on at least a part of the periphery of the ceramic substrate 1, bonding the first and second metal thin sheets 73 and 74 to the surface of the ceramic substrate 11 and the metal frame 72 through the soldering material 76 whereby the ceramic substrate 11 is integrated with the metal frame 72, forming the circuit pattern 77 in the portion of the first metal thin sheet 73 which corresponds to the ceramic substrate 11, and forming the first through-holes 73a, the perforations 72a, and the second through-holes 74a in the first metal thin sheet 73, the metal frame 72, and the second metal thin sheet 74, correspondingly, so as to perforate them.

According to the method of producing the power module substrate, the metal frame 72 integrated with the ceramic substrate 1, and the first and second metal thin sheets 73 and 74 bonded to the front and the back of the metal frame 72, respectively, can be machined easily as compared with the ceramic substrate 11. The first through-holes 73a, the perforations 72a, and the second through-holes 74a are formed so as to perforate the first metal thin sheet 73, the metal frame 72, ad the second metal thin sheet 74, correspondingly, and therefore, the attachment holes can be formed easily at a high precision attachment pitch in the power module substrate.

According to the present invention, there is provided a semiconductor device, as shown in FIG. 2, in which the semiconductor element 23 is mounted on the circuit pattern 17 of the power module substrate 21 of the present invention, a frame piece 25 having terminals 24 provided on the inner periphery thereof is bonded to the surface of the power module substrate 21 so as to surround the semiconductor element 23, the terminals 24 and the semiconductor element 23 are connected to each other, and an insulating gel 29 is filled, a lid plate 25a is bonded to the upper side of the frame piece 25, the male screws 26 are inserted through the through-holes 13a of the metal thin sheet 13 and the perforations 12a of the metal frame 12 in the power module substrate 21, and the power module substrate 21 is joined directly to the water-cooling type heat sink 27 by screwing the male screws 26 in the female screws 27a formed in the water-cooling type heat sink 27 or further inserting through the attachment holes (not shown in FIG. 2) formed so as to perforate the water-cooling type heat sink 27, and screwing the male screws 26 in the nuts.

In this semiconductor device, the heat transfer route from the semiconductor element 23 mounted onto the circuit pattern 17 of the power module substrate 21 joined directly to the water-cooling type heat sink 27 is shorter than the conventional one as shown in FIG. 22, so that heat from the semiconductor element 23 can be more effectively transferred to the water-cooling type heat sink 27 and dissipated outside, as compared with the conventional one.

Further, as shown in FIG. 7, according to the present invention, there is provided a semiconductor device in which the water cooling heat sink 27 comprises a heat sink body 27d having a water passage 27b, and a heat sink lid 27e capable of sealing the water passage 27b, the semiconductor element 23 is mounted to the circuit pattern 17 of the power module substrate 21 of the present invention, the male screws 26 are inserted through the through-holes 13a of the metal thin sheet 13 and the perforations 12a of the metal frame 12 of the power module substrate 21, the power module substrate 21 is joined directly to the heat sink lid 27e by screwing the male screws 26 in the female screws 27f formed in the heat sink lid 27e, a frame piece 25 having terminals 24 provided on the inner periphery thereof is bonded to the surface of the heat sink lid 27e so as to surround the power module substrate 21, the terminals 24 are connected to the semiconductor element 23, and the insulting gel 29 is filled, a lid plate 25a is bonded to the upper side of the frame piece 25, and the heat sink lid 27e is screwed to the heat sink body 27d.

In this semiconductor device, the heat transfer route from the semiconductor element 23 to the water-cooling type heat sink 27 is also shorter than the conventional one, so that heat from the semiconductor element 23 can be more effectively transferred to the water-cooling type heat sink 27 and dissipated outside. In particular, in this semiconductor device, the power module substrate 21 and so forth are previously mounted onto the heat sink lid 27e. Accordingly, the semiconductor device can be obtained by simple working, that is, only by screwing the heat sink lid 27e to the heat sink body 27d.

Still further, as shown in FIG. 10, according to the present invention, there is provided a semiconductor device in which the semiconductor element 23 is mounted to the circuit pattern 77 of the power module substrate 81 of the present invention, the frame piece 25 having the terminals 24 provided on the inner periphery thereof is bonded to the surface of the power module substrate 81 so as to surround the semiconductor element 23, the terminals 24 are connected to the semiconductor element 23, and the insulating gel 29 is filled, the lid plate 25a is bonded to the upper side of the frame piece 25, and the power module substrate 81 is bonded directly to the water-cooling type heat sink 27 with the male screws 26.

In this semiconductor device, the heat transfer route from the semiconductor element 23 mounted onto the circuit pattern 77 of the power module substrate of the present invention, joined directly to the water-cooling type heat sink 27 to the water-cooling type heat sink 27 is shorter than the transfer route of the conventional semiconductor device as shown in FIG. 22. Heat from the semiconductor element 23 can be more effectively dissipated outside through the water-cooling type heat sink 27 as compared with the conventional one.

Further, as shown in FIGS. 14, 16, 19, and 20, according to the present invention, there is provided a semiconductor device in which the semiconductor element 23 is mounted to the circuit pattern 111a of the power module substrate 110, 120 of the present invention, the frame piece 25 having the terminals 24 provided on the inner periphery thereof is bonded to the surface of the power module substrate 110, 120 so as to surround the semiconductor element 23 (FIG. 20), the terminals 24 are connected to the semiconductor element 23, and the insulating gel 29 is filled, the lid plate 25a is bonded to the upper side of the frame piece 25, and the male screws 26 are inserted through the through-holes 116c (FIG. 14) of the collars 116 according to the present invention and the communication holes 118a of the washers 118 according to the present invention and the insertion holes 112b of the metal frame 112 (FIG. 16) according to the present invention, and the power module substrate 110, 120 is joined directly to the water-cooling type heat sink 27 by screwing the male screws 26 in the female screws 27a (FIG. 20) formed in the water-cooling type heat sink 27 or further inserting the male screws 26 through the attachment holes 27c formed so as to perforate the water-cooling type heat sink 27, and screwing the male screws 26 in the nuts 31 (FIG. 19).

In this semiconductor device, the heat transfer route form the semiconductor device 23 mounted onto the circuit pattern 11a of the power module substrate 110, 120 joined directly to the water-cooling type heat sink 27, to the water-cooling type heat sink 27 is shorter than the conventional one as shown in FIG. 22, so that heat from the semiconductor element 23 can be more effectively transferred to the water-cooling type heat sink 27 and dissipated outside, as compared with the conventional one.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
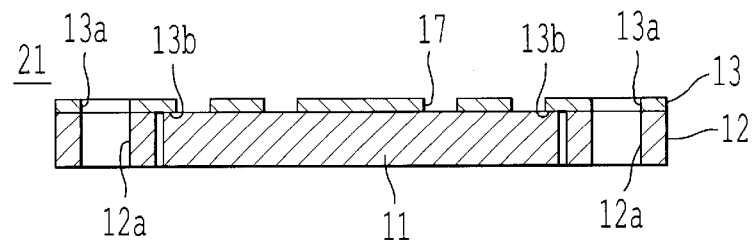
FIG. 1 is a cross sectional view of a power module substrate according to a first embodiment the present invention.

Referring now to the drawings, wherein like reference numerals designate identical or corresponding parts throughout the several views.

Hereinafter, a first embodiment of the present invention will be described with reference to the drawings.

As shown in FIG. 1, the power module substrate of the present invention includes a ceramic substrate 11 having a circuit pattern 17 formed in the surface thereof, a metal frame 12, and metal thin sheets 13. The ceramic substrate 11 has a thickness of 0.635 mm. The circuit pattern 17 is formed by etching a metal foil, though it is not shown in the FIG. 1, which is bonded to the ceramic substrate 11. The bonding of the ceramic substrate 11 to the metal foil, in the case that the metal foil is made of Cu, and the ceramic substrate 11 is done of $Al_2O_3$, is carried out by an active metal method, in which the ceramic substrate 11 and the metal foil are overlaid with an Ag-Cu-Ti soldering material foil as solder being interposed between the ceramic substrate 11 and the metal foil, a load of 0.5~2 kg f/cm² is applied thereon followed by heating at 800~900° C. under vacuum. In the case that the metal foil is made of Cu, and the ceramic substrate 11 is done of AlN, the metal foil is bonded to the ceramic substrate 11 by as the same active metal method as described above.

In the case that the metal foil is made of Al, and the ceramic substrate 11 is done of $Al_2O_3$ or AlN, metal foil with an Al purity of at least 99.98% by weight and a melting point of 660° C. is employed. The metal foil is laminated and bonded through an Al—Si type soldering material having a melting point lower than the metal foil. In particular, the Al—Si type soldering material contains 84 to 97% by weight Al and 3 to 15% by weight Si. The melting point range of the soldering material 16 is 570 to 650° C. As regards the lamination and bonding, a load of 0.5 to 2 kgf/cm² is applied to the ceramic substrate 11 and the metal foil, with a foil as solder, made of the Al—Si soldering material, being interposed between them, and heated at a temperature of 600 to 650° C. under vacuum, whereby the metal foil is bonded to the ceramic substrate 11. The metal foil bonded to the ceramic substrate 11 as described above is etched, so that the circuit pattern 17 is formed.

Figure 3:
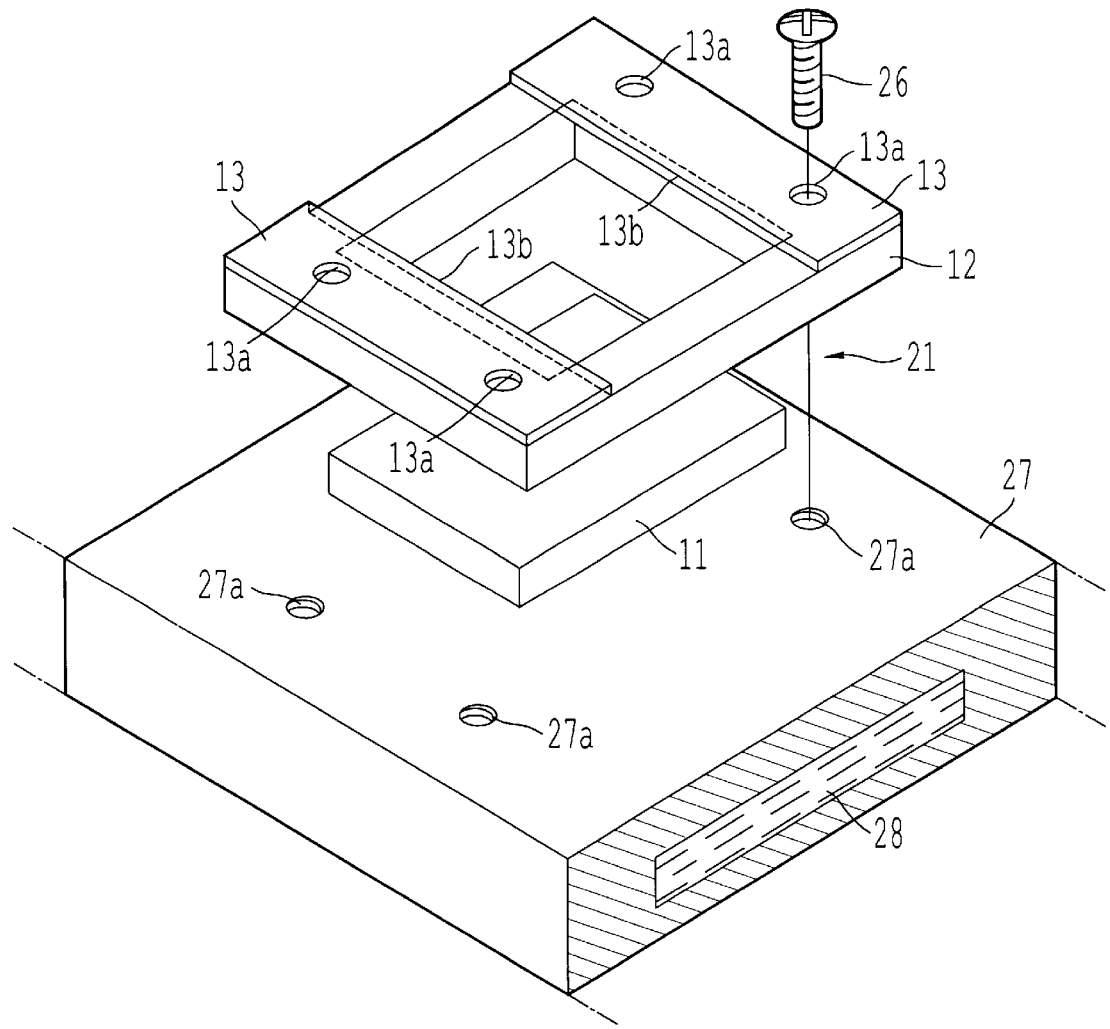
FIG. 3 is a perspective view showing the state that the power module substrate is being secured to a water cooling type heat sink.

As shown in FIGS. 1 and 3, the metal frame 12 has the same thickness as the ceramic substrate 11 or the ceramic substrate 11 having the circuit pattern 17, and is disposed on the periphery of the ceramic substrate 11. The metal frame 12 is made of an aluminum alloy, stainless steel, copper, titanium, Kovar (Fe 54%, Ni 29%, and Co 17%) or a 42 alloy (Fe 58% and Ni 42%). As shown in FIG. 3, in this embodiment, the metal frame 12 is formed so as to surround all the periphery of the ceramic substrate 11, and is shaped to have the thickness equal to that of the ceramic substrate 11 by punching a plate material having the same thickness as the ceramic substrate 11.

The metal thin sheets 13 are disposed on the upper side of the metal frame 12, and have the contacting portions 13b in which the undersides of the metal thin sheets 13 are contacted to the opposite side portions of the ceramic substrate 11 which are a part of the circumferential surface of the ceramic substrate 11. The metal thin sheet is made of stainless steel. In the metal thin sheet 13 and the metal frame 12, through-holes 13a and perforations 12a are formed, correspondingly, so as to perforate them and sandwich the ceramic substrate 11 by machining by means of a working tool such as a drill or the like.

Hereinafter, a semiconductor device including the power module substrate 21 so structured as described above will be described.

Figure 2A:
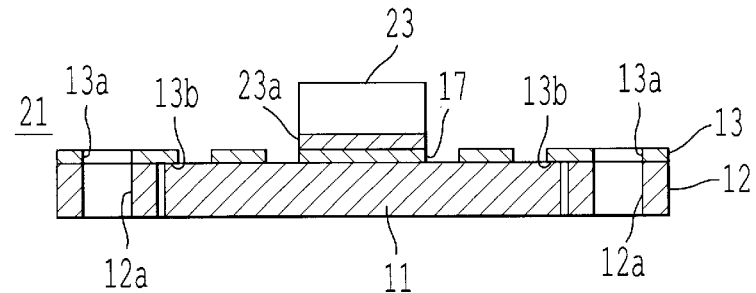
FIGS. 2A, 2B, and 2C constitute a production flow diagram of a semiconductor device including the power module substrate.
Figure 2B:
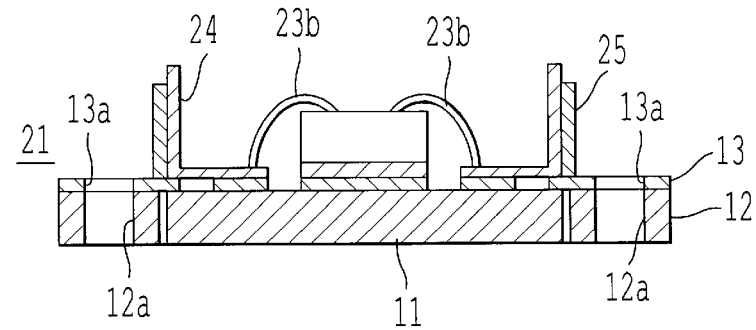
Figure 2C:
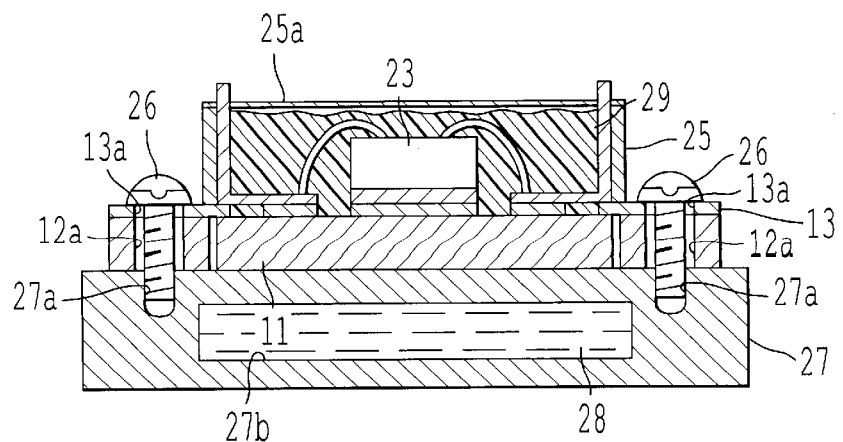

As shown in FIG. 2A, a semiconductor element 23 is mounted onto the circuit pattern 17 formed in the power module substrate 21 by means of solder 23a. On the other hand, the metal frame 12 is disposed so as to surround the ceramic substrate 11. A polyamide type heat-resistant adhesive is applied between the contacting portions 13b of the metal thin sheets 13 and the ceramic substrate 11 having the circuit pattern 17, and between the metal thin sheets 13 and the metal frame 12, respectively, and thereafter, the metal thin sheets 13 are disposed onto the metal frame 12, whereby the metal frame 12, the ceramic substrate 11, and the metal thin sheets 13 are integrated. As shown in FIG. 2B, to the surface of the integrated ceramic substrate 11 and metal thin sheets 13, a frame piece 25 having terminals 24 produced at the inner periphery thereof is bonded so as to surround the semiconductor element 23. The terminals 24 are connected to the semiconductor element 23 through connection wires 23b. After that, as shown in FIG. 2C, an insulation gel such as a silicone gel 29 is filled into the space surrounded by the frame piece 25 to seal the semiconductor element 23. Then, a lid plate 25a is bonded to the upper side of the frame piece 25.

Figure 22:
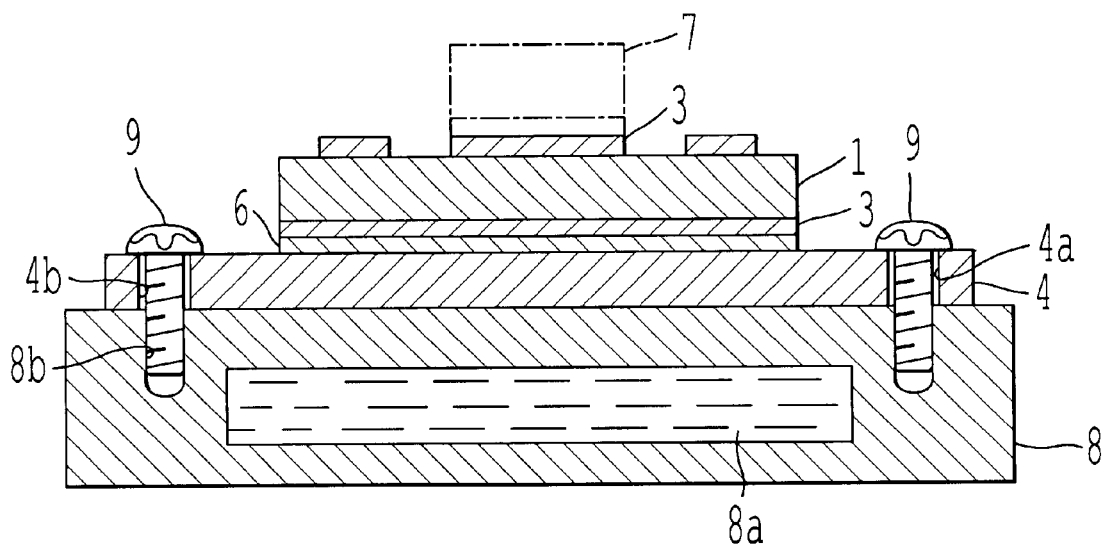
FIG. 22 is a cross sectional view of another conventional example, in correspondence to FIG. 1.

Subsequently, a silicone resin is applied to the portion of the water-cooling type heat sink 27 through which the power module substrate 21 is to be secured to the water-cooling type heat sink 27, if necessary. The ceramic substrate 11 is disposed thereon. Male screws 26 are inserted through the through-holes 13a of the metal thin sheets 13 and the perforations 12a of the metal frame 12, and screwed in female screws 27a formed in the water-cooling type heat sink 27. A water passage 27b through which cooling water 28 is circulated is formed inside of the water-cooling type heat sink 27. Thus, the water-cooling type heat sink 27 has the structure that heat is dissipated outside by circulation of the cooling water 28 through the water passage 27b. To the undersides of the contacting portions 13b of the metal thin sheets 13 which are secured to the water-cooling type heat sink 27 by means of the male screws 26, the upper side of the ceramic substrate 11 having the circuit pattern 17 onto which the semiconductor element 23 is mounted is brought into contact, so that the ceramic substrate 11 is pressed against the contacting portions 13*b*, and joined directly to the water-cooling type heat sink 27, whereby the semiconductor device as shown in FIG. 1 is obtained. In this semiconductor device, the heat transfer route from the semiconductor element 23 to the water-cooling type heat sink 27 is shorter than the conventional transfer route as shown in FIG. 22, heat from the semiconductor element 23 is effectively transferred to the water-cooling type heat sink 27, and dissipated outside.

Figure 4:
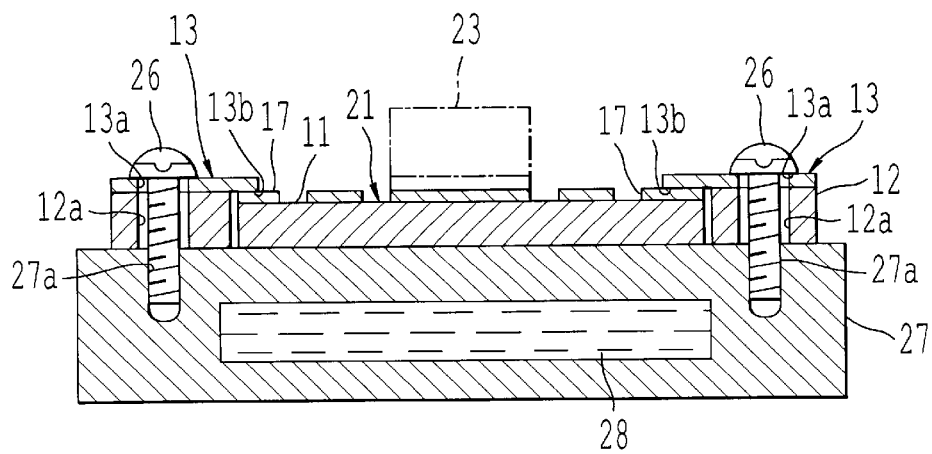
FIG. 4 is a cross sectional view of the semiconductor device including another power module substrate.

In the above-described embodiment, described is the metal thin sheet 13 having the contacting portions 13*b* of which the undersides are contacted to the surface of the ceramic substrate 11. However, as shown in FIG. 4, the undersides of the contacting portions 13*b* may be contacted to the surface of the circuit pattern 17 by employing the metal frame 12 of which the thickness is equal to that of the ceramic substrate 11 having the circuit pattern 17.

Figure 5:
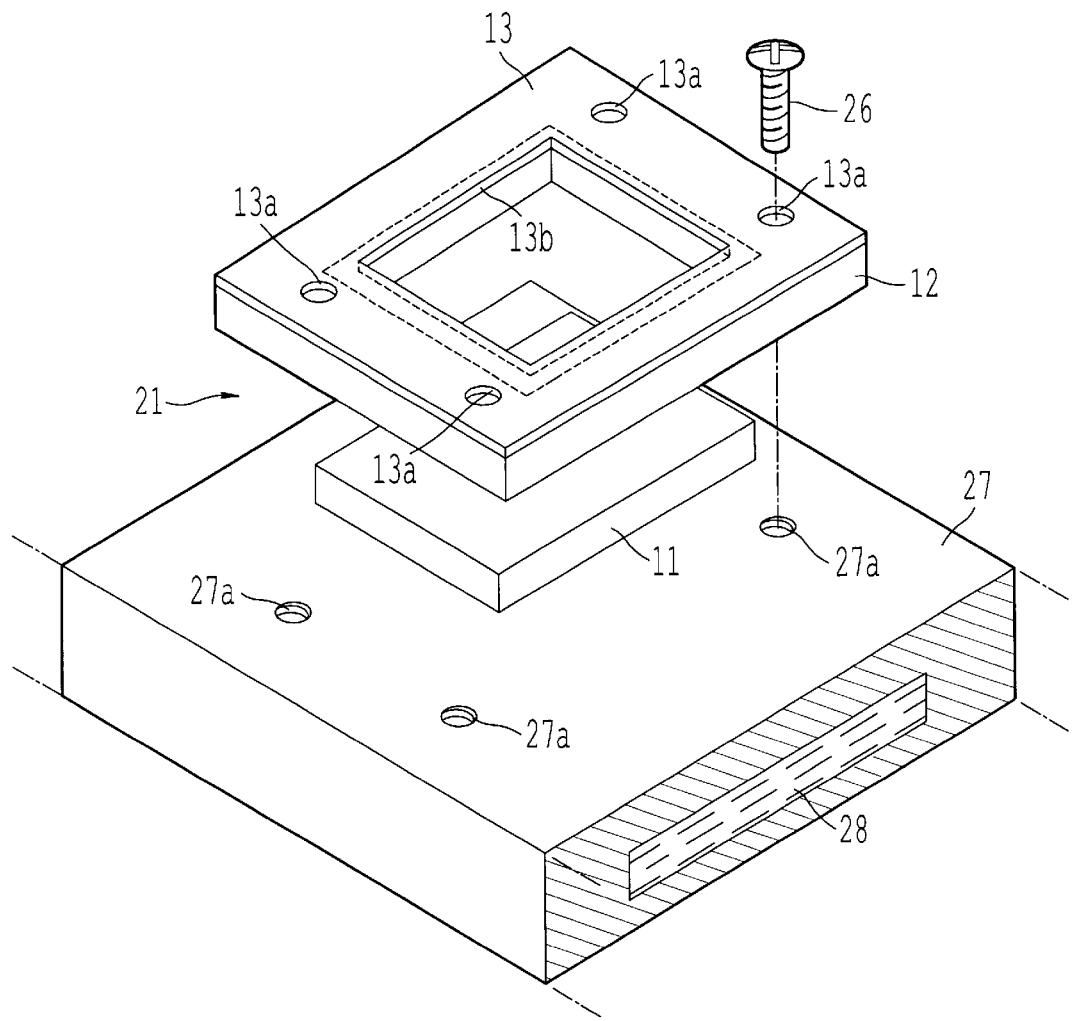
FIG. 5 is a perspective view showing the state that the another power module substrate is being secured/the water-cooling type heat sink.

Further, in the above-described embodiment, the contacting portions 13*b* are formed in the metal thin sheets 13*b* as that the undersides of the contacting portions 13*b* are contacted to the opposite side portions of the ceramic substrate 11 which are a part of the circumferential surface of the ceramic substrate 11. However, as shown in FIG. 5, the metal thin sheets 13 which surround all the periphery of the ceramic substrate 11 having the circuit pattern formed thereon may be formed, and the contacting portions 13*b* of which the undersides are contacted to all the periphery of the ceramic substrate 11 may be formed.

Figure 6:
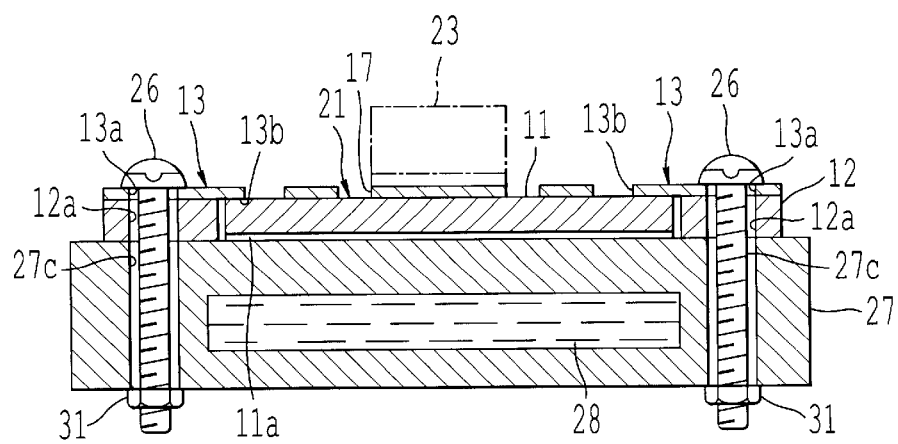
FIG. 6 is a cross sectional view, which corresponds to FIG. 4, showing that the power module substrate is secured by inserting male screws through attachment holes, and screwing the male screws in nuts.

Moreover, in the above-described embodiment, the ceramic substrate 11 having the circuit pattern 17 formed only on the surface thereof is used, and the male screws 26 are inserted through the through-holes 13*a* of the metal thin sheets 13 and the perforations 12*a* of the metal frame 12, and screwed in the female screws 27*a* formed in the water-cooling type heat sink 27. However, as shown in FIG. 6, a metal foil 11*a* may be provided on the back of the ceramic substrate 11, and the male screws 26, inserted through the through-holes 13*a* of the metal thin sheet 13 and the perforations 12*a* of the metal frame 12, may be further inserted through attachment holes 27*c* formed so as to perforate the water-cooling type heat sink 27, and screwed in nuts 31.

Figure 7:
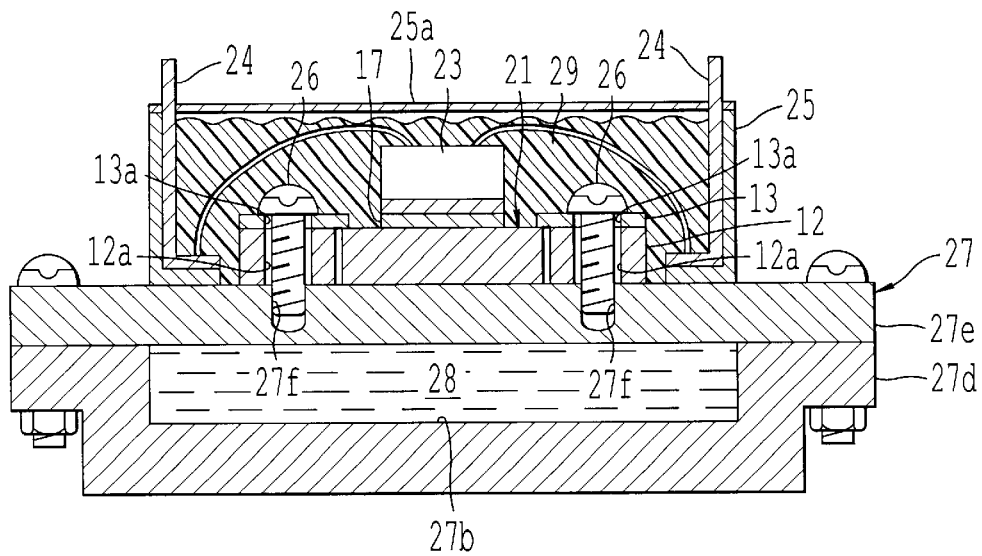
FIG. 7 is a cross sectional view, which corresponds to FIG. 2C, showing that a frame piece is bonded to the surface oft water-cooling type heat sink.

Furthermore, in the above embodiment, described is the semiconductor device in which the frame piece 25 is bonded to the surface of the power module substrate 21. However, as shown in FIG. 7, in the case that the water-cooling type heat sink 27 comprises a heat sink body 27*d* having the water passage 27*b*, and a heat sink lid 27*e* capable of sealing the water passage 27*b*, the frame piece 25 may be bonded to the surface of the heat sink lid 27*e* so as to surround the power module substrate 21. Especially, this is suitable for a semiconductor device which includes the small-sized power module substrate 21 with the small semiconductor element 23 of which the heating quantity is relatively large. Concretely, in the semiconductor device of FIG. 7, the semiconductor element 23 is mounted onto the circuit pattern 17 of the power module substrate 21, and the power module substrate 21 is joined directly to the heat sink lid 27*e* by inserting the male screws 26 through the through-holes 13*a* of the metal thin sheet 13 and the perforations 12*a* of the metal frame 12, and screwing the male screws 26 in the female screws 27*f* formed in the heat sink lid 27*e*.

The frame piece 25 having the terminals 24 provided at the inner periphery thereof is bonded to the surface of the heat sink lid 27*e* so as to surround the power module substrate 21. The terminals 24 are connected to the semiconductor element 23, the insulating gel 29 is filled, and a lid plate 25*a* is bonded to the upper sides of the frame piece 25. As described above, the semiconductor device can be produced by screwing the heat sink lid 27*e* having the power module substrate 21 or the like mounted thereto, to the heat sink body 27*d*. In the semiconductor device as shown in FIG. 7, the heat transfer route from the semiconductor element 23 to the water-cooling type heat sink 27 is shorter than the conventional one. Heat from the semiconductor element 23 can be effectively transferred to the water-cooling type heat sink 27, and dissipated outside. Especially, the power module substrate 21 or the like is previously mounted onto the heat sink lid 27*e*, and thereby, the semiconductor device can be produced by the simple work, that is, only by screwing the heat sink lid 27*e* to the heat sink body 27*d*.

Figure 8A:
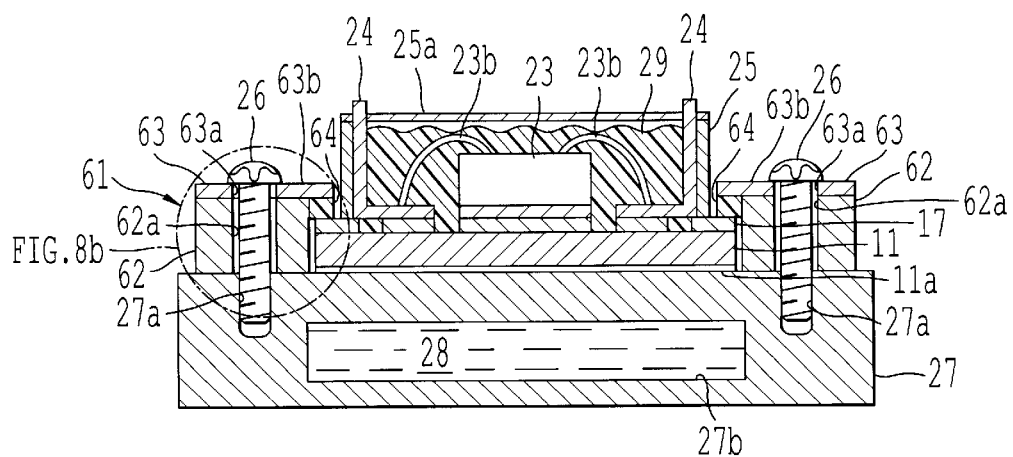
FIG. 8 is a cross sect view of a semiconductor device according to a second embodiment of the present invention, in correspondence to FIG. 2C.
Figure 8B:
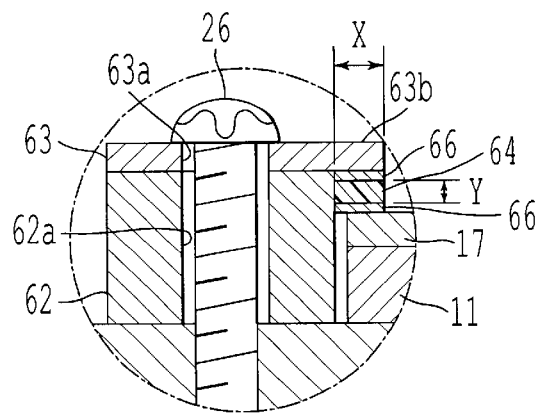

Hereinafter, a second embodiment of the present invention will be described with reference to FIG. 8. In FIG. 8 and the above-described embodiments, similar parts are designated by similar reference numerals, and the repeated description is omitted.

As shown in FIG. 8, the power module substrate 61 of this embodiment includes the ceramic substrate 11 having the circuit pattern 17 formed on the surface thereof, a metal frame 62, and metal thin sheets 63. The metal frame 62 has a thickness larger than the ceramic substrate 11 or the ceramic substrate 11 having the circuit pattern 17, and is disposed on the periphery of the ceramic substrate 11. The metal frame 62 is formed by punching a plate material made of an aluminum alloy, stainless steel, copper, titanium, Kovar (Fe 54%, Ni 29%, and Co 17%), a 42 alloy (Fe 58% and Ni 42%), or the like, into such a shape that it surrounds all the periphery of the ceramic substrate 11. In the metal frame 62, perforations 62*a* are formed so as to perforate the metal frame 62 and sandwich the ceramic substrate 11, by machining with a working tool such as a drill or the like.

The metal thin sheets 63 are disposed on the upper side of the metal frame 62, and has opposing portions 63*b* of which the undersides are opposed to a part or the whole of the circumferential surface of the ceramic substrate 11 or the circuit pattern 17. In FIG. 8, the opposing portions 63*b* are opposed to the circuit pattern 17. The metal thin sheets 63 are made of stainless steel. In the metal thin sheets 63, through-holes 63*a* perforating the metal thin sheets 63 are formed in communication with the perforations 62*a* of the metal frame 62 by machining with a working tool such as a drill or the like. The elastic pieces 64 are interposed between the ceramic substrate 11 or the surface of the circuit pattern 17 and the opposing portions 63*b*. In this embodiment, the elastic pieces 64 are formed by punching a synthetic rubber sheet which has a thickness equal to the difference between the thickness of the ceramic substrate 11 or the ceramic substrate 11 having the circuit pattern 17 and that of the metal frame 62, or has a thickness slightly larger than the difference, to have a rectangular cross-section. In this case, each elastic piece 64 is so formed as to satisfy the ratio X/Y =0.08 or more in which X represents the width of the cross-section, and Y the thickness of the elastic piece 64. The both of the upper side and the underside of the elastic piece 64 are bonded to the surface of the ceramic substrate 11 or the circuit pattern 17 and that of the opposing portion 63*b*, correspondingly, through a heat resistant adhesive.

In the case that the ceramic substrate 11 has the metal 11*a* bonded to the back thereof preferably the surface of the metal foil 11*a* and that of the water-cooling type heat sink 27 are adjusted so that the bearing pressure P of the metal foil 11a against the water-cooling type heat sink 27 generated when the ceramic substrate 11 is joined to the water-cooling type heat sink 27 satisfies the formula of $\mu P \leqq 10$ (MPa) in which $\mu$ represents the coefficient of friction between the metal foil 11a and the water-cooling type heat sink 27. When the surface pressure P and the coefficient $\mu$ of friction satisfies the formula of $\mu P<10$ (MPa), the ceramic substrate 11 can be displaced in the horizontal direction, caused by the thermal expansion, and thereby, breaking of the ceramic substrate 11 can be prevented.

In order that the semiconductor device is produced by use of the power module substrate 61 structured as described above, first, the semiconductor element 23 is mounted onto the circuit pattern 17, the metal frame 62 is disposed on the periphery of the semiconductor element 23. Subsequently, a polyamide type heat-resistant adhesive is applied to the opposing portions 63b of the metal thin sheets 63, the surface of the circuit pattern 17 or the ceramic substrate 11 opposed to the opposing portions 63b, and both of the upper side and the underside of the elastic piece 64. Then, the elastic pieces 64 are disposed onto the circumferential surface of the circuit pattern 17, and the metal thin sheet 63 is placed on the metal frame 62. Accordingly, the metal frame 62, the ceramic substrate 11, the elastic pieces 64, and the metal thin sheet 63 are integrated. After that, to the surface of the ceramic substrate 11, the frame piece 25 provided with the terminals 24 is bonded. The terminals 24 are connected to the semiconductor element 23 through connection wires 23b. Into the space surrounded by the frame piece 25, the insulating gel 29 is filled, so that the semiconductor element 23 is sealed. The lid plate 25a is bonded to the upper side of the frame piece 25.

Subsequently, a silicone resin is applied to the portion of the water-cooling type heat sink 27 to which the power module substrate 61 is to be secured, if necessary. The ceramic substrate 11 is disposed thereon. The male screws 26 are inserted through the through-holes 63a of the metal thin sheet 63 and the perforations 62a of the metal frame 62, and screwed in the female screws 27a formed in the water-cooling type heat sink 27. To the undersides of the opposing portions 63b of the metal thin sheets 63 which are: secured to the water-cooling type heat sink 27 by means of the male screws 26, the upper side of the circuit pattern 17 is brought into contact through the elastic pieces 64. The ceramic substrate 11 is pressed by the opposing portion 63b through the elastic pieces 64 to be joined directly to the water-cooling type heat sink 27. Thus, the semiconductor device as shown in FIG. 8 is obtained. In this semiconductor device, the heat transfer route from the semiconductor element 23 to the water-cooling type heat sink 27 is shorter than the conventional transfer route, and the heat can be effectively dissipated.

The temperatures of the ceramic substrate 11 and the water-cooling type heat sink 27 itself rises due to the transfer of heat from the semiconductor element 23, and are expanded, respectively. In this case, generally, the thermal expansion coefficient of the ceramic substrate 11 is lower than that of the water-cooling type heat sink 27 made of a metal. Accordingly, the length in the perforation 62a of each male screw 26 screwed in the female screw 27a becomes larger than that of the perforation 62a. However, the increase in length of the male screw 26 is absorbed by the elastic piece 64, contributed to its elasticity, to become allowable. In particular, the attachment error between the ceramic substrate 11 and the water-cooling type heat sink 27, caused by the expansion or shrinkage of the elastic piece 64, is absorbed, contributed to the elasticity, so that, breaking of the ceramic substrate 11, caused by the change of the temperature, is prevented.

In the above-described second embodiment, described is the semiconductor device in which the frame piece 25 is bonded to the surface of the power module substrate 61, and the male screws 26 are screwed in the female screws 27a formed in the water-cooling type heat sink 27. However, as described in the first embodiment, the male screws 26 may be further inserted through the attachment holes 27c formed in the water-cooling type heat sink 27 so as to perforate it, and screwed in the nuts 31 (FIG. 6). In the case that the water-cooling type heat sink 27 comprises the heat sink body 27d having the water passage 27b and the heat sink lid 27e capable of sealing the water passage 27b, the frame piece 25 may be bonded to the surface of the heat sink lid 27e to surround the power module substrate 61 (FIG. 7).

Hereinafter, a third embodiment of the present invention will be described with reference to FIGS. 9 through 13. In these figures and in the above-described embodiments, similar reference numerals designate similar parts, and the repeated description is omitted.

Figure 13:
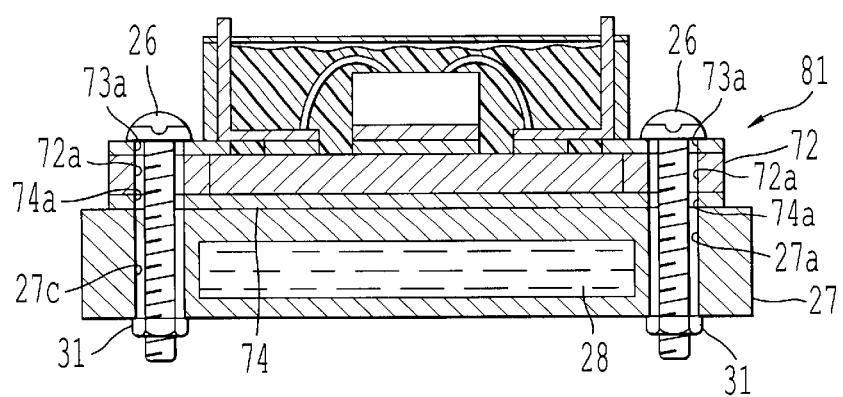
FIG. 13 is a cross sectional view of another semiconductor device including the above power module substrate, in correspondence to the FIG. 10C.

As shown in FIGS. 9 and 13, in this embodiment, a power module substrate 81 comprises the ceramic substrate 11, a metal frame 72 provided wholly on the periphery of the ceramic substrate 11, having a thickness equal to or slightly smaller than the ceramic substrate 11 and having perforations 72a formed to sandwich the ceramic substrate 11, a first metal thin sheet 73 bonded to the surfaces of the ceramic substrate 11 and the metal frame 72 through a soldering material 76, and having first through-holes 73a in communication with the perforations 72a and a circuit pattern 77 formed on the portion thereof opposing to the ceramic substrate 11, and a second metal thin sheet 74 bonded to the backs of the ceramic substrate 11 and the metal frame 72 through a soldering material, having second through-holes 74a in communication with the perforations 72a and the first through-holes 73a, and being opposed to the water-cooling type heat sink 27.

Hereinafter, a method for producing a power module substrate 81 will be described.

(a) Disposition of Metal Frame on Periphery of Ceramic Substrate

Figure 9A:
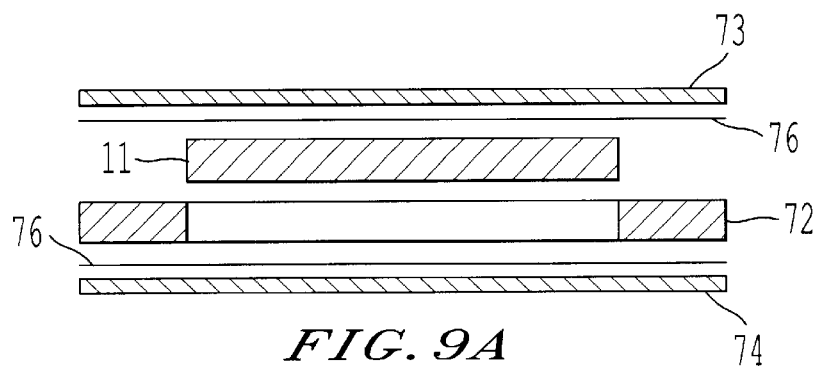
FIGS. 9A through 9D constitute a flow diagram showing the method of producing a power module substrate according to third embodiment of the present invention.
Figure 11:
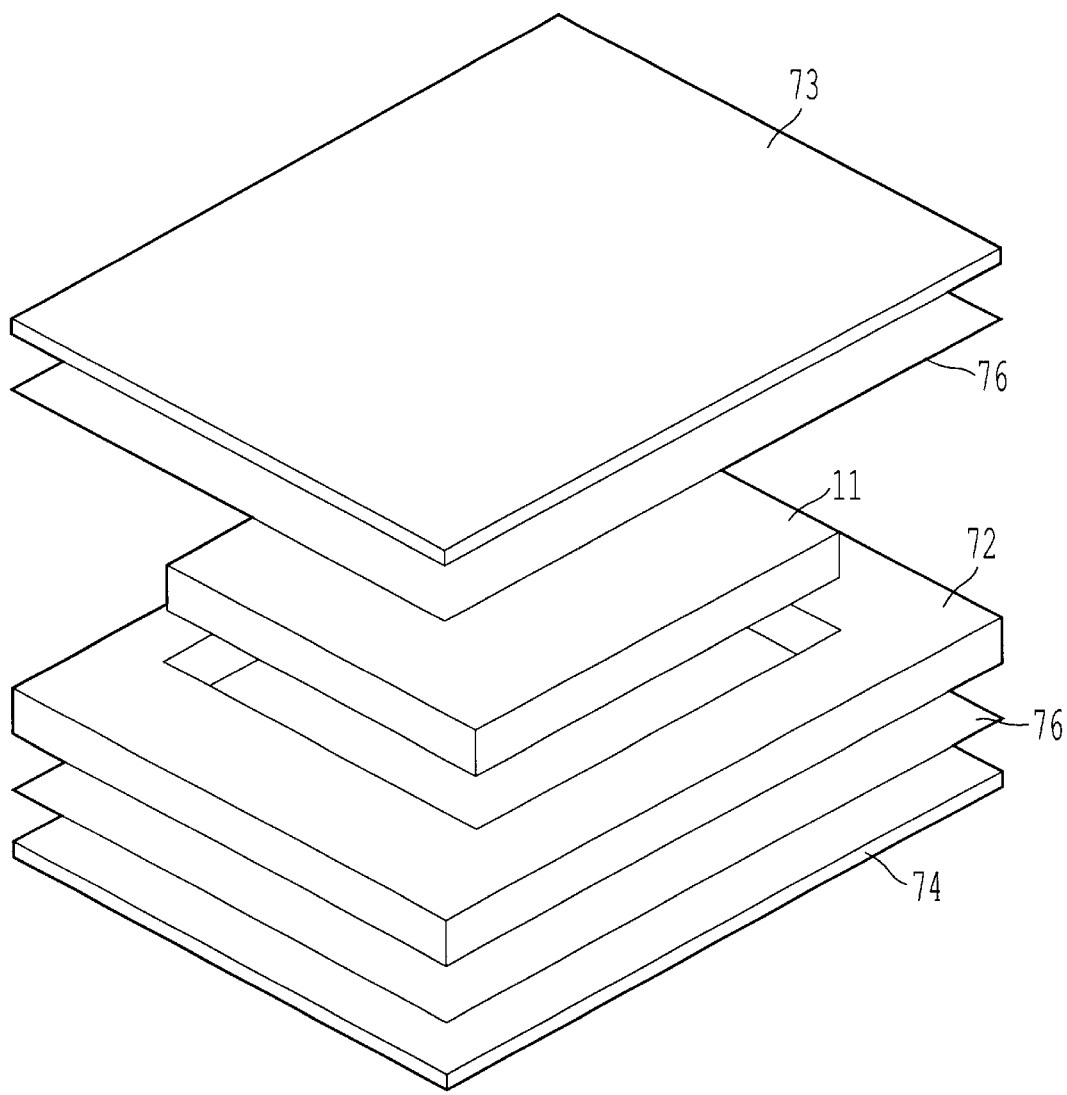
FIG. 11 is a perspective view showing the relation among the ceramic substrate, the metal frame, and the first and second metal thin sheets.

As shown in FIG. 9A and FIG. 11, the ceramic substrate 11 is made of $Al_2O_3$, AlN, $Si_3N_4$, or SiC, and the metal frame 72 is done of an aluminum alloy, stainless steel, titanium, Kovar (Fe 54%, Ni 29%, and Co 17%) or a 42 alloy (Fe 58% and Ni 42%). As shown in FIG. 11, in the embodiment, the metal frame 72 is formed to surround all the periphery of the ceramic substrate 11 and is shaped by punching a sheet material having a thickness equal to or slightly smaller than the ceramic substrate 11 to have the same thickness as the ceramic substrate 11.

(b) Lamination-Bonding of First and Second Metal thin Sheets Ceramic Substrate and Metal Frame The first and second metal thin sheets 73 and 74 are formed with Cu or Al, and are so shaped as to have the same profile as the metal frame 72.

Figure 9B:
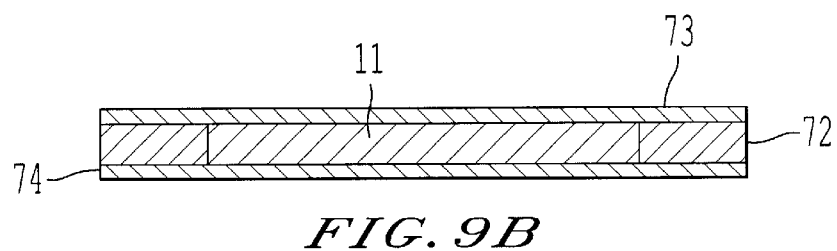

In the case that the first and second metal thin sheets 73 and 74 are made of Cu, and the ceramic substrate 11 is done of $Al_2O_3$, the metal frame 72 is formed with stainless steel or copper. As shown in FIG. 9A and FIG. 11, the first and second metal thin sheets 73 and 74 are laminated and bonded to the ceramic substrate 11 and the metal frame 72 by the active metal method by which the ceramic substrate 11, the metal frame 72, and the metal thin sheets are overlaid with soldering material foils of Ag—Cu—Ti being interposed between them, and a load of 0.5 to 2 kgf/cm² is applied, followed by heating at a temperature of 800 to 900° C. under vacuum whereby the ceramic substrate 11 and the metal frame 72 are integrated as shown in FIG. 9B.

Further, in the case that the first and second metal thin sheets 73 and 74 are made of Cu, and the ceramic substrate 11 with AlN, the metal frame 72 is also formed with stainless steel or copper. The first and second metal thin sheets 73 and 74 are laminated and bonded to the substrate 11 and the metal frame 72 by the same active metal method as described above, whereby the ceramic substrate 11 and the metal frame 72 are integrated as shown in FIG. 9B.

Further, in the case that the first and second metal thin sheets 73 and 74 are made of Al, and the ceramic substrate 11 is done of $Al_2O_3$, AlN, or $Si_3N_4$, the metal frame 72 is formed with stainless steel or an aluminum alloy. Preferably, as the aluminum alloy, an alloy with an Al purity of at least 99.5% by weight is used. Preferably, for the first and second metal thin sheets 73 and 74, an alloy with an Al purity of at least 99.98% by weight and a melting point of 660° C. is used. To the metal frame 72, the first and second metal thin sheets 73 and 74 are laminated and bonded through the Al—Si type soldering material 76 of which the melting point is lower than that of the first and second metal thin sheets 73 and 74. That is, the Al—Si type soldering material 76 contains 87 to 84% by weight Al and 11 to 13.5% by weight Si, and the dissolution temperature range of the soldering material 76 is 570 to 590° C. As regards the lamination and bonding, the Al—Si type soldering material foil as the soldering material 76 is interposed between the ceramic substrate 11 and the first and second metal thin sheets 73 and 74, respectively, and in this state, a load of 0.5 to 2 kgf/cm² is applied, followed by heating at a temperature of 600 to 650° C. under vacuum, whereby the first and second metal thin sheets 73 and 74 are laminated and bonded to the ceramic substrate 11 and the metal frame 72, and the ceramic substrate 11 and the metal frame 72 are integrated as shown in FIG. 9B.

Figure 9C:
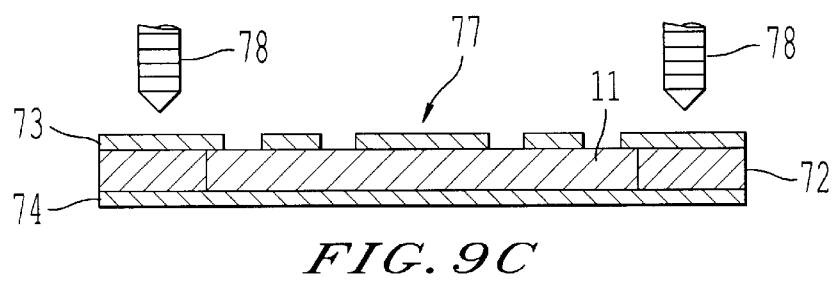
Figure 9D:
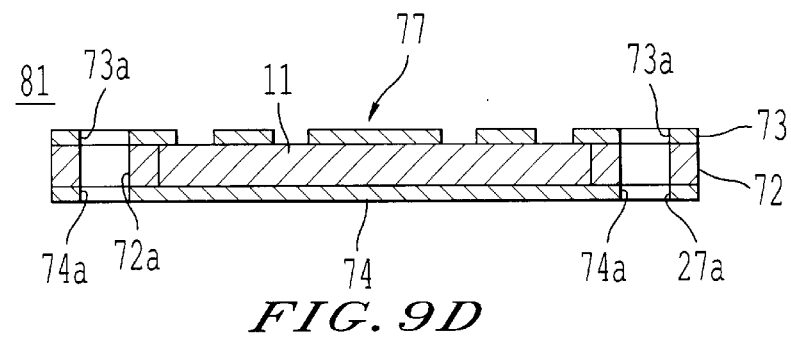

(c) Formation of Circuit Pattern and Formation of First Through-Hole, Perforation, and Second Through-Hole As shown in FIG. 9C, in the portion of the first metal thin sheets 73 corresponding to the ceramic substrate 11, the predetermined circuit pattern 77 is formed by an etching method. The first metal thin sheet 73, the metal frame 72, and the second metal thin sheet 74 are machined by means of a drill 78, and as shown in FIG. 9D, first through-holes 73a, perforations 72a, and second through-holes 74a perforating them are formed to sandwich the ceramic substrate 11, respectively, whereby the power module substrate 81 is produced.

(d) Semiconductor Device

Figure 10A:
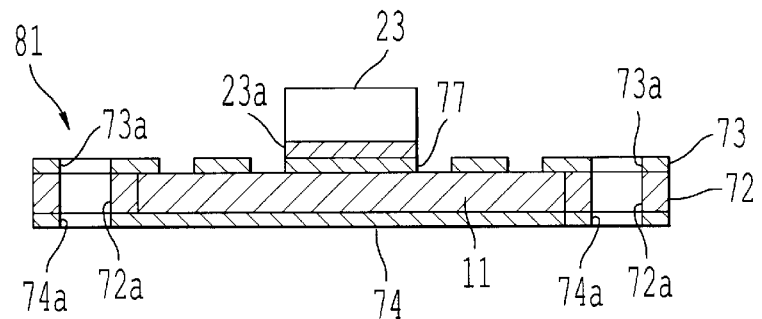
FIGS. 10A, 10B, and 10C constitute a production flow diagram of a semiconductor device including the above substrate.
Figure 10B:
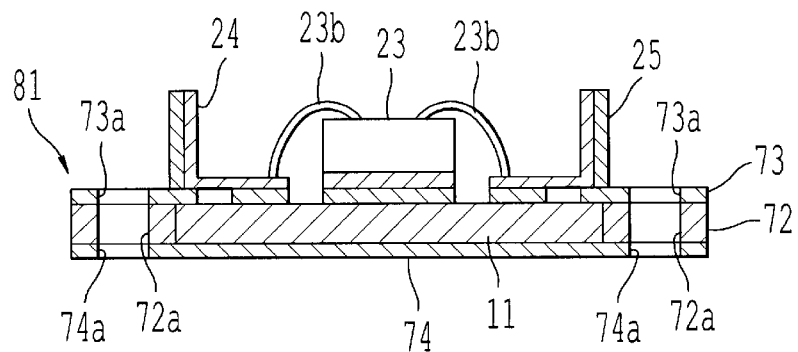
Figure 10C:
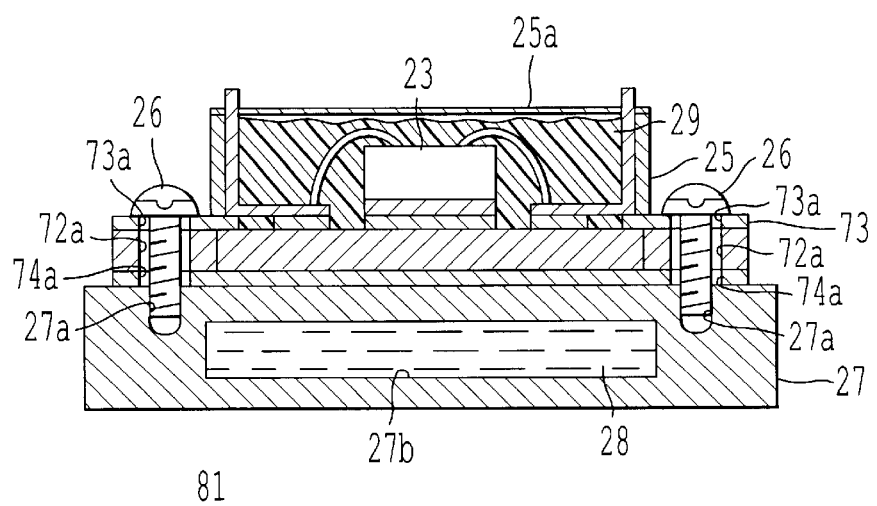

As shown in FIG. 10A, the semiconductor element 23 is mounted by use of solder 23a, onto the circuit pattern 77 formed in the first metal thin sheet 73 of the power module substrate 81. On the other hand, as shown in FIG. 10B, the frame piece 25 having the terminals 24 provided at the inner periphery thereof is bonded to the surface of the power module substrate 81 so as to surround the semiconductor element 23. The terminals 24 are connected to the semiconductor element 23 through the connection wires 23b. After that, as shown in FIG. 1C, an insulating gel such as silicone gel 29 is filled into the space surrounded by the frame piece 25 to seal the semiconductor element 23. Then, the lid plate 25a is bonded to the upper side of the frame piece 25. As described above, the male screws 26 are inserted through the first through-holes 73a, the perforations 72a, and the second through-holes 74a of the power module substrate 81 having the semiconductor element 23 mounted thereto, and screwed in the female screws 27a formed in the water-cooling type heat sink 27. The water-cooling type heat sink 27 is so structured that the water passage 27b through which the cooling water 28 is circulated is formed inside of the water-cooling type heat sink 27, and heat is dissipated outside by circulation of the cooling water 28 through the water passage 27b. The power module substrate 81 is joined directly to the water-cooling type heat sink 27 by means of the male screws 26. The heat transfer route from the semiconductor element 23 mounted onto the circuit pattern 77 of the power module substrate 81 to the water-cooling type heat sink 27 is shorter than the conventional one shown in FIG. 22. Heat from the semiconductor element 23 is effectively transferred to the water-cooling type heat sink 27 and dissipated outside.

Figure 12:
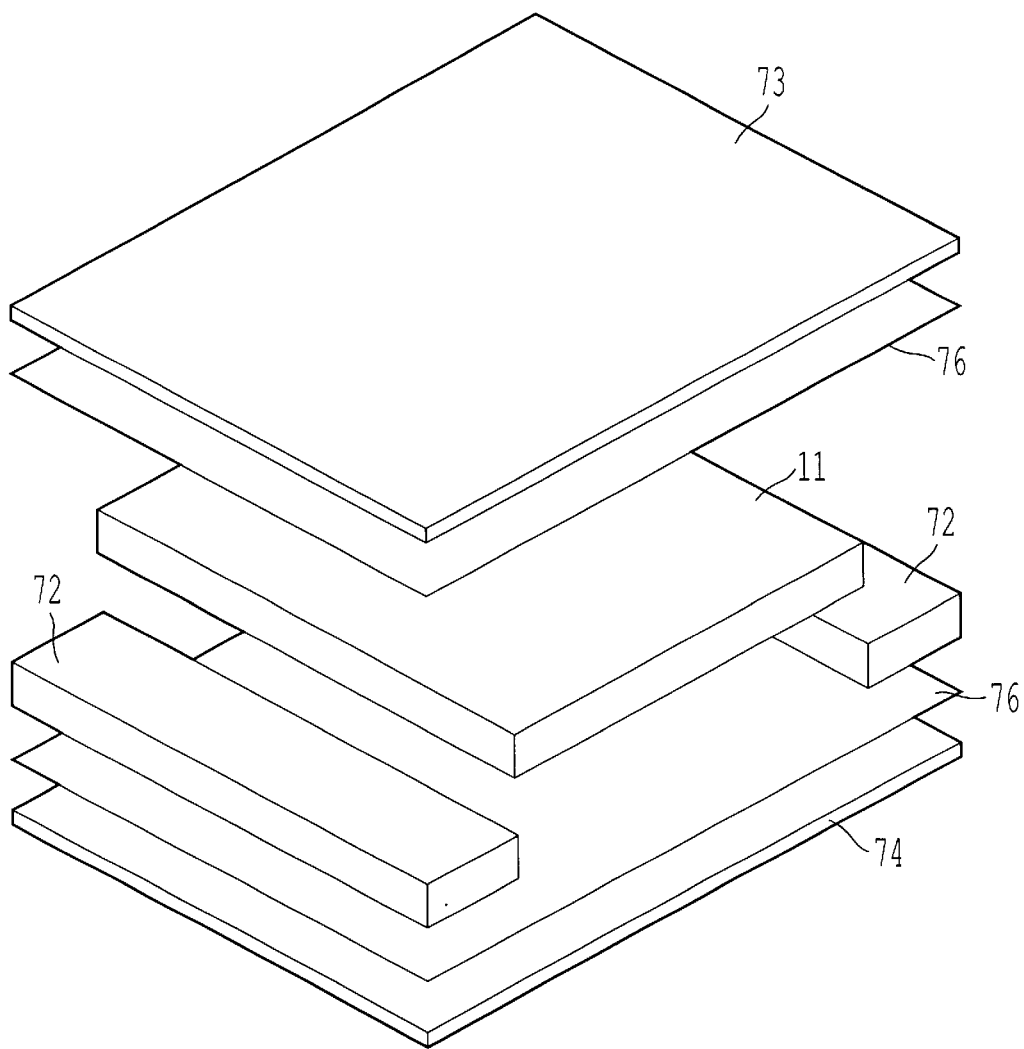
FIG. 12 is a perspective view showing the relation among another ceramic substrate, the metal frame, and the first and second metal thin sheets.

In the above-described embodiment, formed is the metal frame 72 surrounding all the periphery of the ceramic substrate 11. However, as shown in FIG. 12, the metal frames 72 sandwiching the ceramic substrate 11 on the opposite sides thereof which are a part of the periphery of the ceramic substrate 11 may be provided.

Further, in the above-described embodiment, the power module substrate 81 is joined directly to the water-cooling type heat sink 27 by means of the male screws 26 which are screwed in the female screws 27a formed in the water-cooling type heat sink 27. As shown in FIG. 13, the power module substrate 81 may be joined directly to the water-cooling type heat sink 27 by further inserting the male screws 26 through the attachment holes 27c formed to perforate the water-cooling type heat sink 27, and screwing the male screws 26 in the nuts 31.

Hereinafter, a fourth embodiment of the present invention will be described with reference to the drawings.

Figure 14A:
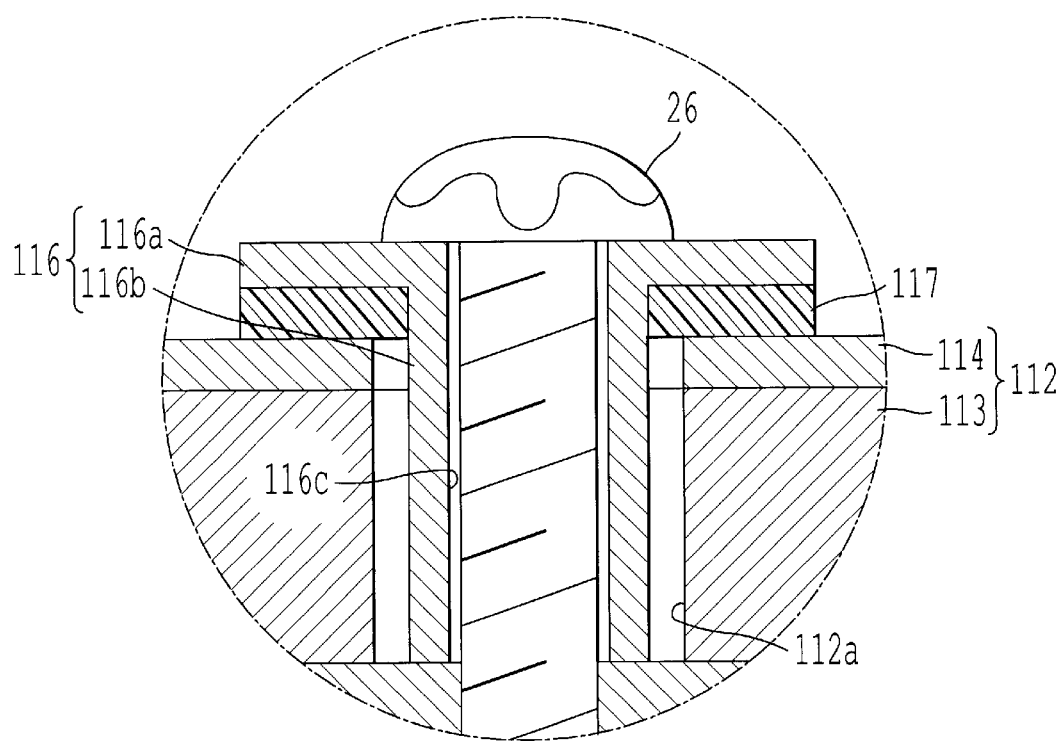
FIG. 14 is a cross sectional view of a power module substrate according to a fourth embodiment of the present invention.
Figure 14B:
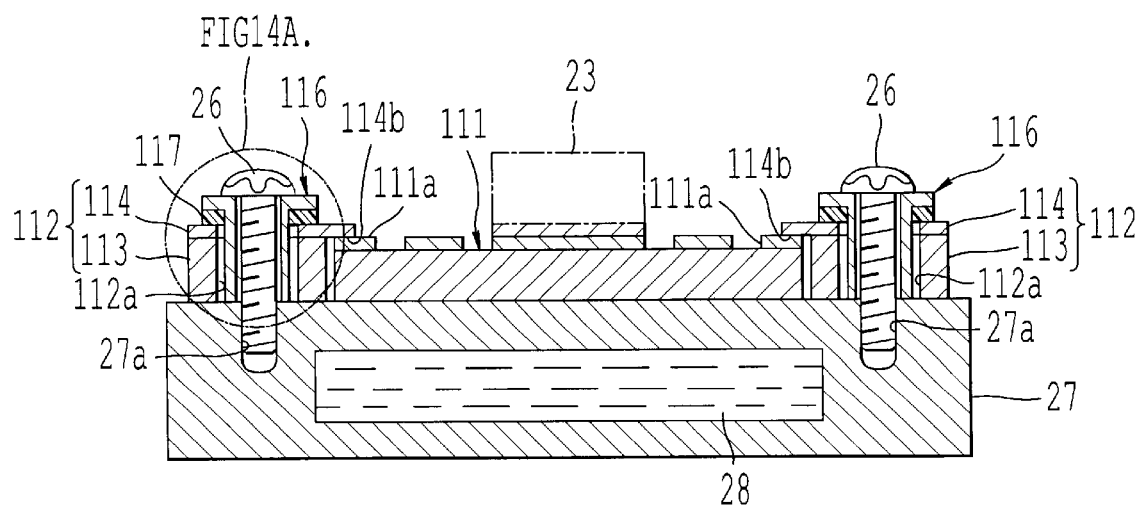
Figure 15:
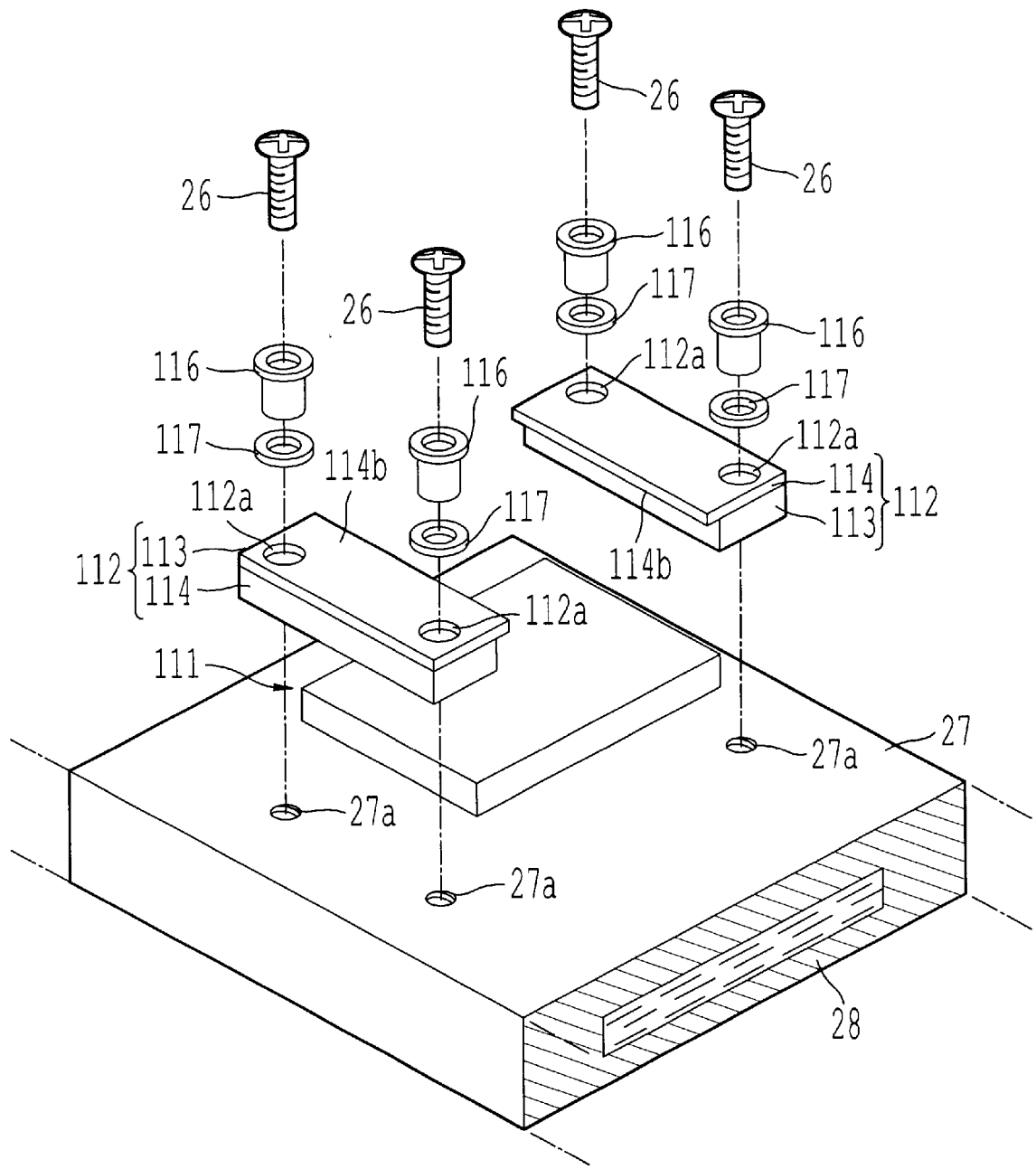
FIG. 15 is a perspective view showing the state that the power module substrate is being secures the water-cooling type heat sink.

As shown in FIGS. 14 and 15, a power module substrate 110 of the present invention includes a ceramic substrate 111 having a circuit pattern 111a formed on the surface thereof, and metal frames 112. The circuit pattern 111a is formed in the same manner as that in the first embodiment. Each metal frame 112 comprises a frame body 113 and a metal thin sheet 114. The frame body 113 is formed by working a metal of which the thickness is equal to that of the ceramic substrate 111 or the ceramic substrate 111 having the circuit pattern 111a. As the metal constituting the frame body 113, an aluminum alloy, stainless steel, copper, titanium, Kovar (Fe 54%, Ni 29%, and Co 17%) or a 42 alloy (Fe 58% and Ni 42%), and do forth are exemplified. The metal thin sheets 114 are formed with stainless steel. The metal thin sheets 114 each are bonded to the upper sides of the frame body 113 by soldering or welding, and contain contacting portions 114b of which the undersides are contacted to the opposite side portions of the substrate 111 which are a part of the circumferential surface of the ceramic substrate 111.

In each of the metal frames 112 formed by bonding of the metal thin sheet 114 to the frame body 113, perforations 112a perforating them are formed by machining by means of a working tool such as a drill or the like. As shown in FIG. 15, in this embodiment, the metal frames 112, after soldering materials (not shown) are interposed between the contacting portions 114b of the metal thin sheet 114 and the circuit pattern 111a, are disposed on the opposite sides of the ceramic substrate 111, respectively. After that, by raising the temperature to a predetermined value, the metal frames 112 are secured on the opposite sides of the ceramic substrate 111 in such a manner that the perforations 112a sandwich the ceramic substrate 111. In this case, as the soldering material, employed is an Al type soldering material having a melting point higher than solder to be used when the semiconductor element 23 described below is mounted to the circuit pattern 111a. As the Al type soldering material, Al-7.5Si, Al-12Si, Al-10Si-4Cu, or Al-95Zn are exemplified.

As shown in FIGS. 14 and 15, the power module substrate 110 includes collars 116 and elastic pieces 117. In each collar 116, a cylindrical portion 116a having such an outside diameter that it can be floating-inserted through the perforation 112a and a flange 116b in contact to the upper side of the metal frame 112 are integrally formed. In the collar 116, a through-hole 116c perforating the flange 116b and the cylindrical portion 116a is formed. Each elastic piece 117 is formed by punching a synthetic rubber sheet into a doughnut shape. This doughnut-shaped elastic piece 117 is fitted onto the cylindrical portion 116a, and in this state, the collar 116 is floating-inserted into the perforation 112a, whereby the elastic piece 117 is interposed between the flange 116b and the upper side of the metal frame 112.

Figure 19:
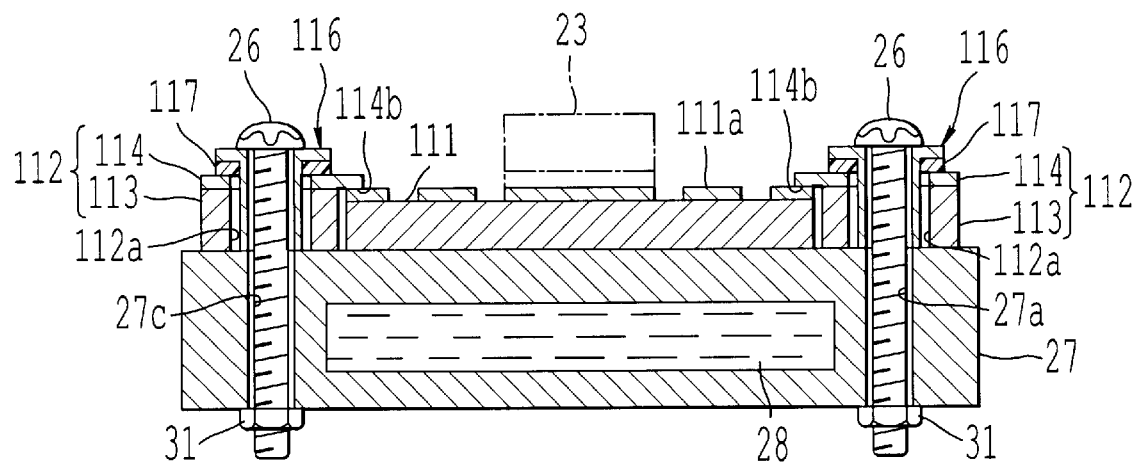
FIG. 19 is a cross sectional view of a power module substrate attached by insertion of the male screws through attachment holes of the water-cooling type heat sink, in correspondence to the FIG. 14.

This power module substrate 110 is so structured that the male screws 26 are inserted through the through-holes 116c of the collars 116, and screwed in the female screws 27a formed in the water-cooling type heat sink 27, or further inserted through the attachment holes 27c formed to perforate the water-cooling type heat sink 27 as shown in FIG. 19, and screwed in the nuts 31.

In the power module substrate 110, the ceramic substrate 111 is joined to the water-cooling type heat sink 27 with the male screws 26 and by use of the perforations 112a. However, the tightening force of the male screws 26 is applied to the metal frame 112, not directly to the ceramic substrate 111. For this reason, no breaking of the ceramic substrate 111, caused by the tightening force of the male screws 26, occurs. Heat from the semiconductor element 23 mounted onto the circuit pattern 111a can be effectively transferred to the water-cooling type heat sink 27.

Further, since heat from the semiconductor element 23 is transferred, the ceramic substrate 111 and the water-cooling type heat sink 27 itself, are expanded, respectively, with the temperatures rising. Generally, the coefficient of thermal expansion of the ceramic substrate 111 is lower than that of the water-cooling type heat sink 27 made of a metal. Accordingly, the length in the perforation 112a of each male screw 26 screwed in the female screw 27a becomes longer than that of the perforation 112a. However, the increase in length of the male screw 26 is absorbed by the elastic pieces 117, contributed by the elasticity, to become allowable. That is, the elastic pieces 117 absorbs the attachment error between the ceramic substrate 111 and the water-cooling type heat sink 27, caused by the expansion or shrinkage, contributed to the elasticity, and prevents the breaking of the ceramic substrate 111, caused by the change of temperature.

A semiconductor device including the power module substrate 110 so structured as described above will be now described.

Figure 20A:
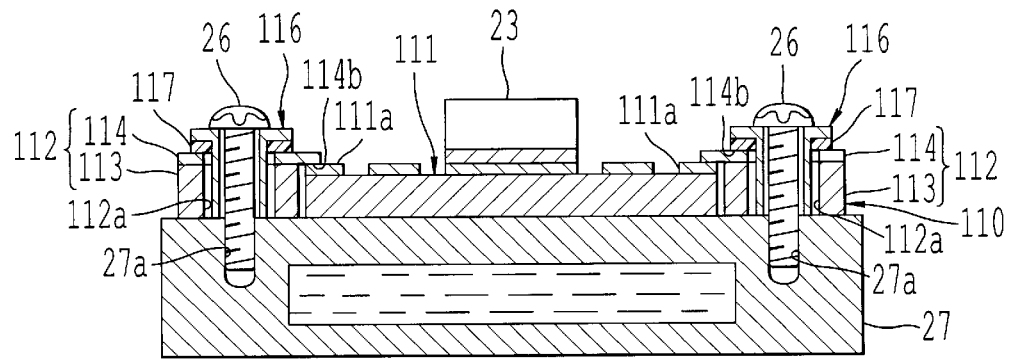
FIGS. 20A t constitute a production flow diagram of the semiconductor device including the above power module substrate.
Figure 20B:
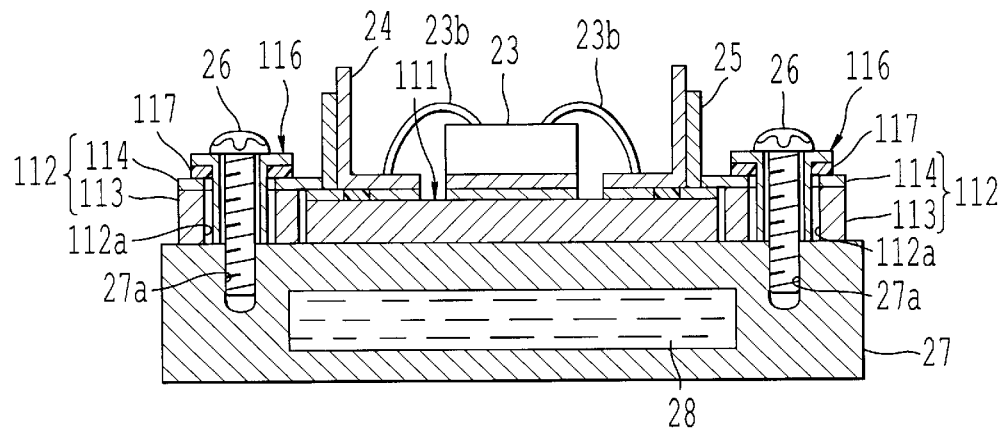
Figure 20C:
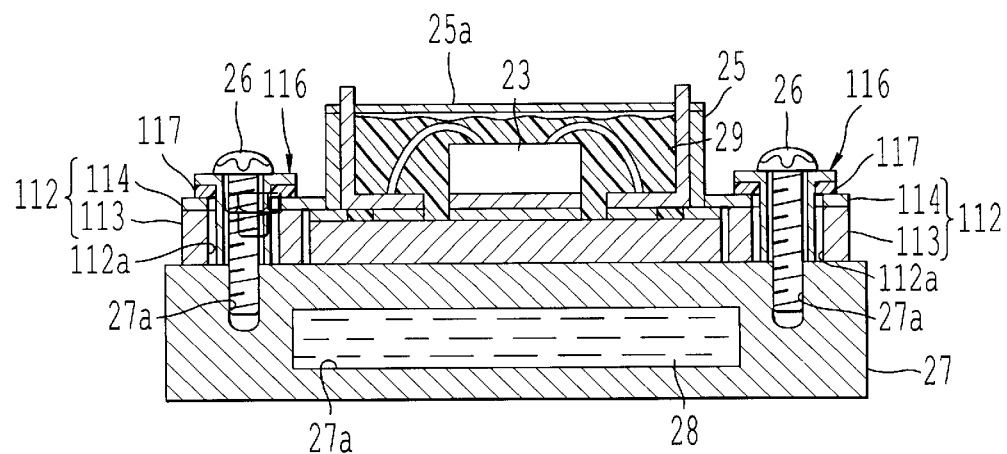
Figure 21:
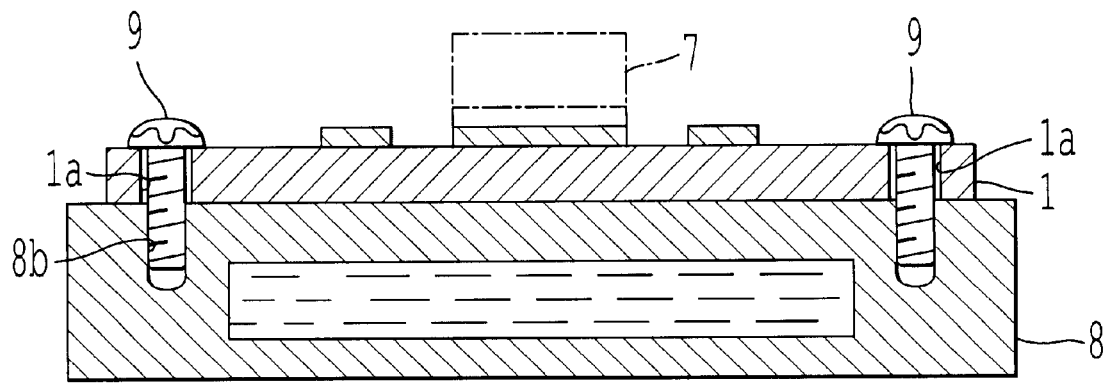
FIG. 21 is a cross sectional view of a conventional example, in correspondence to FIG. 1.

First, as shown in FIG. 20A, the semiconductor element 23 is mounted onto the circuit pattern 111a formed on the power module substrate 110 by use of solder 23a. As shown in FIG. 20B, to the surface of the power module substrate 110 having the semiconductor element 23 mounted thereto, the frame piece 25 having the terminals 24 provided at the inner periphery thereof is bonded to surround the semiconductor element 23. The terminals 24 are connected to the semiconductor element 23 through the connection wires 23b. As shown in FIG. 20C, an insulating gel such as a silicone gel 29 is filled into the space surrounded by the frame piece 25. After the semiconductor element 23 is sealed by the filling of the insulating gel, the lid plate 25a is bonded to the upper side of the frame piece 25.

Subsequently, a silicone resin is applied to the portion of the water-cooling type heat sink 27 to which the power module substrate 110 is to be secured, if necessary. The ceramic substrate 111 is disposed thereon. The water-cooling type heat sink 27 is so structured that the water passage 27b through which the cooling water 28 is circulated is formed inside of the water-cooling type heat sink 27, and heat is dissipated outside by circulation of the cooling water 28 through the water passage 27b. The male screws 26 are inserted through the through-holes 116c of the collars 116. The male screws 26 are screwed in the female screws 27a formed in the water-cooling type heat sink 27. Accordingly, the ceramic substrate 111 is joined directly to the water-cooling type heat sink 27 to obtain the semiconductor device.

In this semiconductor device, the heat transfer route from the semiconductor element 23 to the water-cooling type heat sink 27 is shorter than the conventional one as shown in FIG. 22, so that heat from the semiconductor element 23 can be effectively transferred to the water-cooling type heat sink 27 and dissipated outside.

In the above-described semiconductor device, the male screws 26 are screwed in the female screws 27a formed in the water-cooling type heat sink 27. However, as shown in FIG. 19, the semiconductor device may be produced by further inserting the male screws 26 through the attachment holes 27c formed to perforate the water-cooling type heat sink 27, and screwing the male screws 26 in the nuts 31, respectively.

Figure 16A:
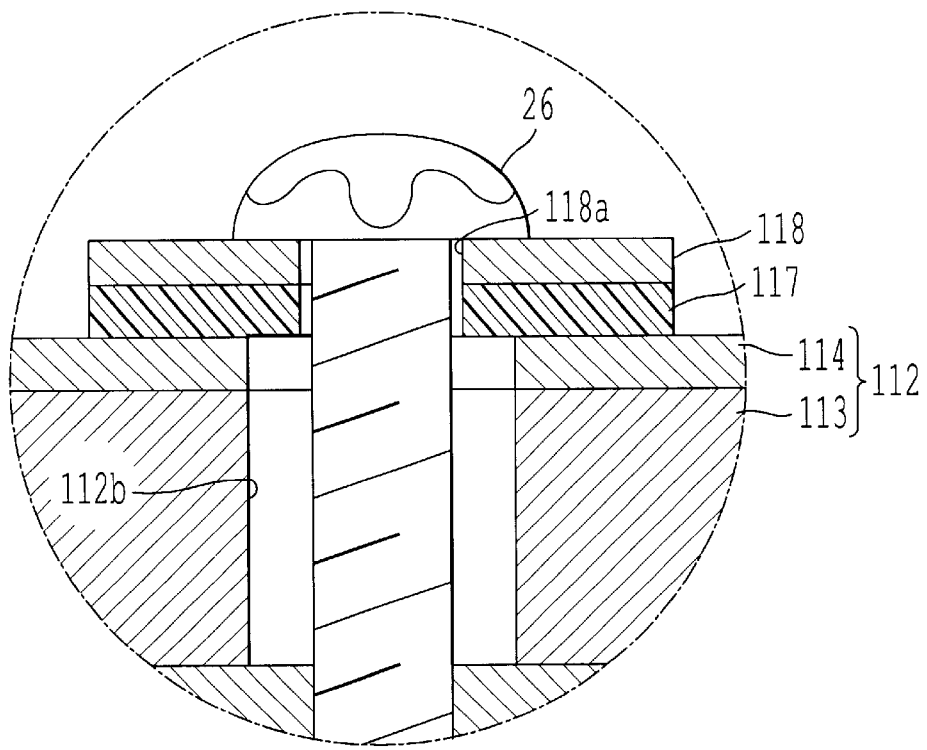
FIG. 16 is a cross sectional view of a power module substrate according to a fifth embodiment of the present invention.
Figure 16B:
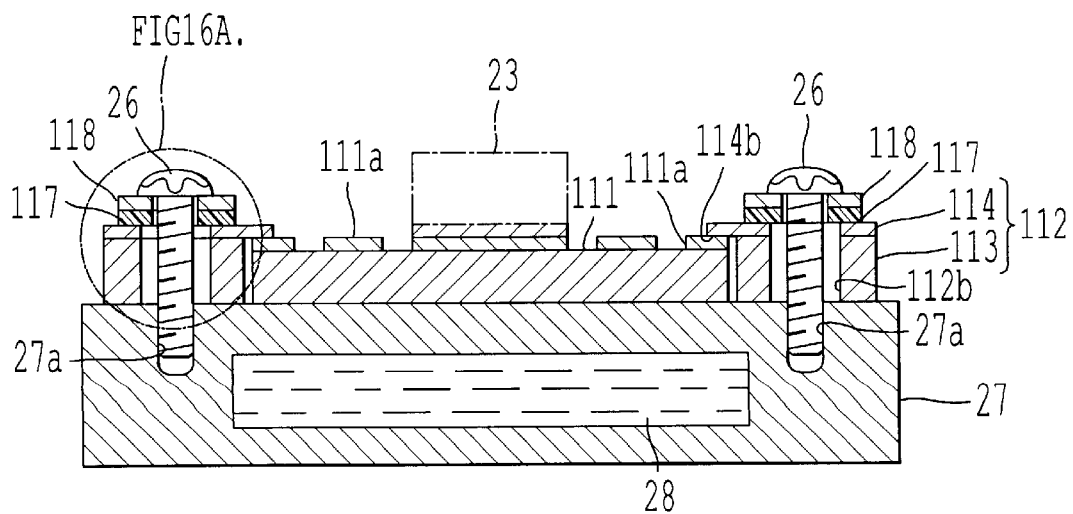
Figure 17:
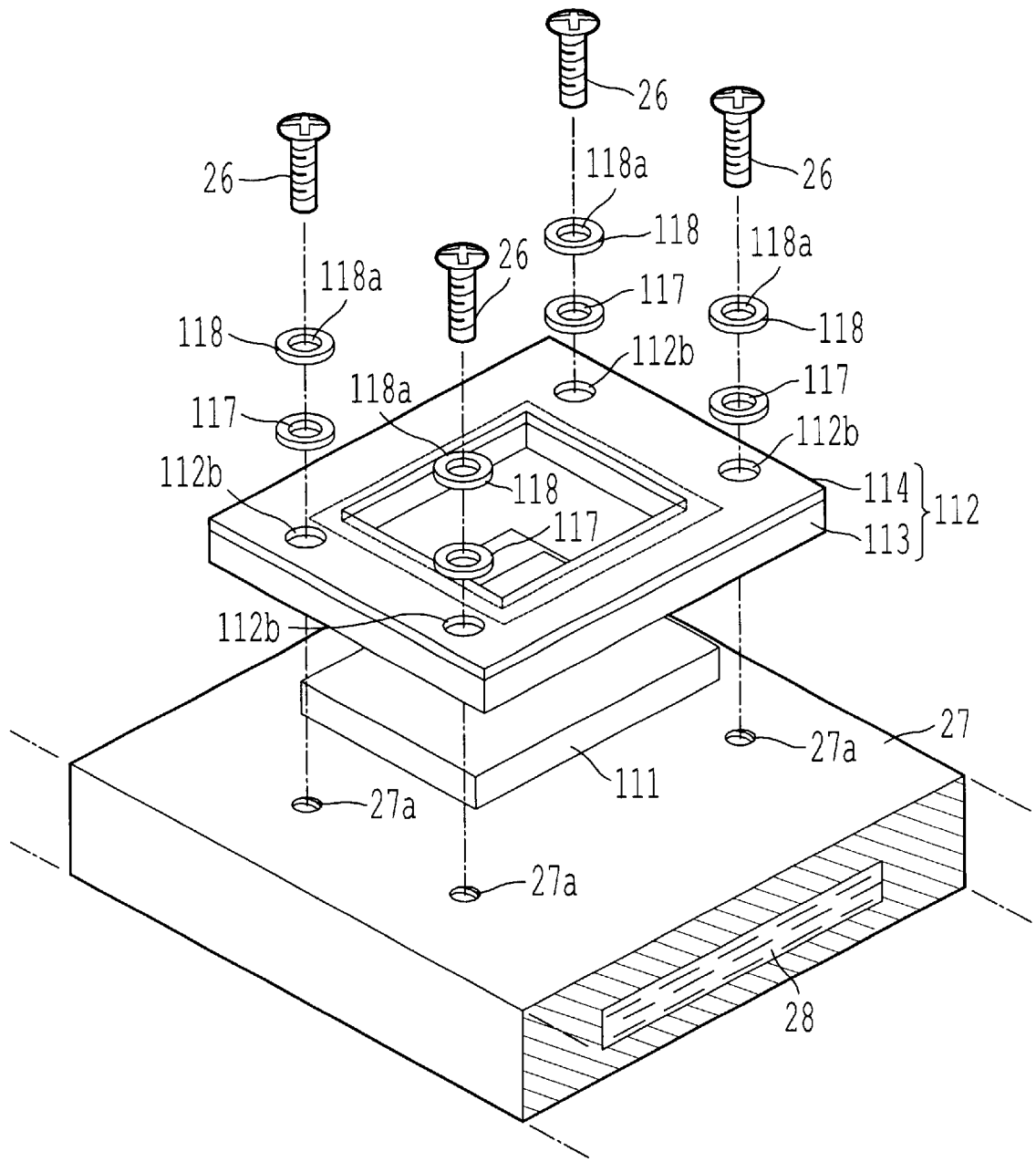
FIG. 17 is a perspective view showing the state that the power module substrate is being secure to the water-cooling type heat sink.

A fifth embodiment of the power module substrate of the present invention will be described with reference to FIGS. 16 and 17. In FIGS. 16 and 17 and the above-described embodiments, similar parts are designated by similar reference numerals, and the repeated description is omitted.

As shown in FIG. 17, the frame body 113 and the metal thin sheet 114 are formed in a quadrangular shape so as to surround all the periphery of the ceramic substrate 111. The metal thin sheet 114 is formed so that the underside is brought into contact to all the circumferential surface of the ceramic substrate 111. In the metal frames 112 formed by bonding of the above-described metal thin sheets 114 to the frame bodies 113, insertion holes 112b are formed in the opposite side portions of each of the metal frames 112, by machining with a working tool such as a drill or the like, so as to sandwich ceramic substrate 111. The metal frame 112 is secured to the ceramic substrate 111 by overlaying the contacting portions 114b of the metal thin sheet 114 on the circuit pattern 111a through the Al soldering material, and raising the temperatures to a predetermined value so that the contacting portions 114b are joined to a part or the whole of the circuit pattern 111a. As the Al type soldering material, Al-7.5Si, Al-12Si, Al-10Si-4Cu, or Al-95Zn are exemplified. The joining of the contacting portions 114b to a part of the circuit pattern 111a is carried out in the case that the coefficients of thermal expansion of the ceramic substrate 111 and the metal frame 112 are different. When the contacting portions 114b are joined to the whole of the circuit pattern 111a, it is necessary that the coefficients of thermal expansion of the ceramic substrate 111 and the metal frame 112 are substantially the same.

Moreover, a power module substrate 120 is provided with washers 118 and the elastic pieces 117. In the washers 118, communication holes 118a in communicate with the insertion holes 112b, respectively, are formed. On the other hand, each elastic piece 117 is formed by punching a synthetic rubber sheet with elasticity into a doughnut shape. The washers 118 are disposed on the upper side of the metal frame 112 through the doughnut-shaped elastic pieces 117, respectively.

The power module substrate 120 is so structured that the ceramic substrate 111 having the metal frame 112 secured thereto is joined to the water-cooling type heat sink 27 by floating-inserting the male screws 26, inserted through the communication holes 118a of the washers 118, through the insertion holes 112b of the metal frame 112, and screwing the male screws 26 in the female screws 27a formed in the water-cooling type heat sink 27 or further inserting the attachment holes 27c formed to perforate the water-cooling type heat sink 27, and screwing the male screws 26 in the nuts 31, respectively.

In this power module substrate 120, the ceramic substrate 111 is joined to the water-cooling type heat sink 27 with the male screws 26 and by use of the perforations 112b. However, the tightening force of the male screws 26 is applied to the metal frame 112, not directly to the ceramic substrate 111. For this reason, no breaking of the ceramic substrate 111, caused by the tightening force of the male screws 26, occurs. Heat from the semiconductor element 23 mounted onto the circuit pattern 111a can be effectively transferred to the water-cooling type heat sink 27. When heat from the semiconductor element 23 is transferred so that the ceramic substrate 111 and the water-cooling type heat sink 27 itself are expanded, and the length in the insertion hole 112b of each male screw 26 becomes larger than that of each insertion hole 112b, the increase in length of the male screw 26 is absorbed by the elastic piece 117, contributed by the elasticity. Thus, breaking of the ceramic substrate 111, caused by the change of temperature, can be prevented.

Figure 18:
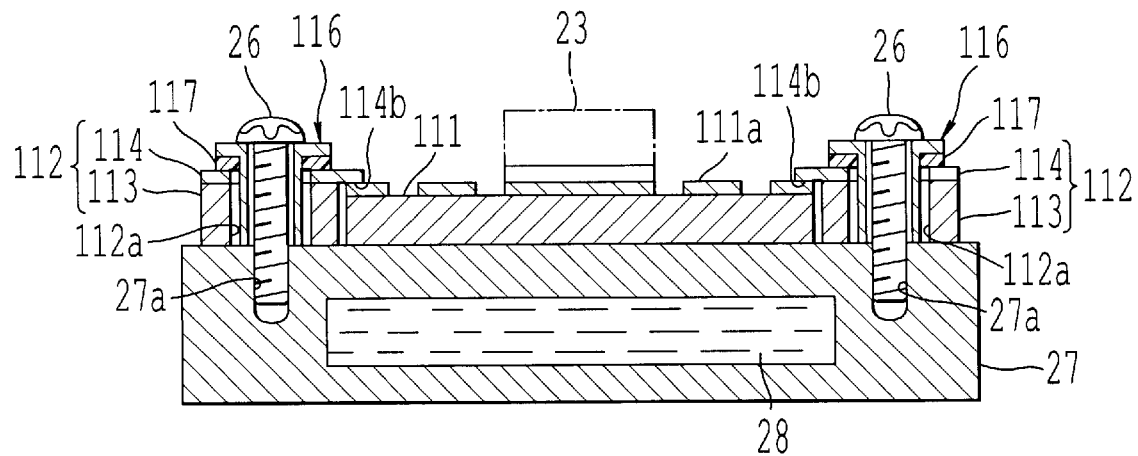
FIG. 18 is a cross sectional view of a further power module substrate of the present invention.

In the above-described embodiment, the metal frame 112 is secured to the ceramic substrate 111 by soldering the contacting portions 114b of the metal thin sheet 114 and the circuit pattern 111a to each other wholly or partially. However, the metal frame 112 may be secured to the ceramic substrate 111 by joining the contacting portions 114b directly to the ceramic substrate 111 as shown in FIG. 18.

Further, in the above-described embodiment, the metal frame 112 is formed by bonding the metal thin sheet 114 to the frame body 113. However, the metal thin sheet may be formed integrally with the metal frame by cutting the metal frame and so forth, on condition that it can be secured to the whole or a part of the periphery of the ceramic substrate 111.

In the semiconductor device including the power module substrate 120 structured as described above, the ceramic substrate 111 having the metal frame 112 secured thereto is joined to the water-cooling type heat sink 27 by floating-inserting the male screws 26, inserted through the communication holes 118a of the washers 118, through the insertion holes 112b of the metal frame 112, screwing the male screws 26 in the female screws 27a formed in the water-cooling type heat sink 27 or further inserting the male screws 26 through the attachment holes 27c formed to perforate the water-cooling type heat sink 27, and screwing them in the nuts 31, respectively, to obtain the semiconductor device. In the semiconductor device including the above-described power module substrate 120, the heat transfer route from the semiconductor element 23 to the water-cooling type heat sink 27 is shorter than the conventional one as shown in FIG. 22. Heat from the semiconductor element 23 can be effectively transferred to the water-cooling type heat sink 27 and dissipated outside.

As described above, according to the present invention, preferably, the power module substrate is so structured that the metal frame having the plural perforations is provided on the periphery of the ceramic substrate, the metal thin sheets having the through-holes in communication with the perforations and the contacting portions having the undersides thereof contacted to at least a part of the circumferential surface of the ceramic substrate or the circuit pattern is disposed on the surface of the metal frame, whereby the ceramic substrate can be joined to the water-cooling type heat sink by inserting the male screws through the through-holes and the perforations, and screwing the male screws in the female screws formed in the water-cooling type heat sink or further inserting the male screws through the attachment holes formed in the water-cooling type heat sink and screwing the male screws in the nuts. Accordingly, no tightening force of the male screws is applied directly to the ceramic substrate. Thus, breaking of the ceramic substrate, caused by the tightening force of the male screws, can be prevented.

When the metal frame and the metal thin sheet disposed on the surface of the metal frame are of such a type that they can be machined relatively easily as compared with the ceramic substrate, the formation of the through-holes and the perforations can be easily formed, and the attachment holes can be easily produced at a high precision attachment pitch. When the elastic pieces are interposed between the surface of the ceramic substrate or the circuit pattern and the opposing portions of the metal thin sheets, the attachment error between the ceramic substrate and the water-cooling type heat sink, caused by the expansion or shrinkage, is absorbed by the elastic pieces, contributed by the elasticity. Accordingly, breaking of the ceramic substrate, caused by the change of temperature can be prevented. In this case, by bonding the elastic pieces with the heat resistant adhesive, the movement of the elastic pieces are prevented, so that the ceramic substrate contacted to the undersides of the opposed portions through the elastic pieces can be effectively joined to the water-cooling heat sink.

Preferably, the metal frame is provided on at least a part of the periphery of the ceramic substrate, has a thickness equal to or slightly smaller than that of the ceramic substrate, and has plural perforations formed so as to sandwich the ceramic substrate, the first metal thin sheet having the first through-holes in communication with the corresponding perforations, having the circuit pattern formed in the portion of the first metal thin sheet opposed to the ceramic substrate is bonded to the surface of the ceramic substrate and that of the metal frame, and the second metal thin sheet having the second through-holes in communication with the perforations and the first through-holes, respectively, and opposed to the water-cooling type heat sink is bonded to the back of the ceramic substrate and that of the metal frame. Accordingly, when the male screws are inserted through the first through-holes, the perforations, and the second through-holes formed in the first metal thin sheet, the metal frame and the second metal thin sheet, correspondingly, and screwed in the female screws formed in the water-cooling type heat sink or further inserted through the attachment holes formed in the water-cooling type heat sink and screwed in the nuts, no tightening force of the male screws is applied directly to the ceramic substrate, so that breaking of the ceramic substrate, caused by the tightening force of the male screws, can be prevented.

By bonding the first and second metal thin sheets to integrate the ceramic substrate and the metal frame with each other, and thereafter, forming the first through-holes, the perforations, and the second through-holes in the first metal thin sheet, the metal frame, and the second metal thin sheet, correspondingly, so as to perforate them, the attachment holes can be formed easily and at a high precision attachment pitch in the power module substrate.

Further, since the flanges of the collars or the washers floating-inserted through the perforations are disposed on the upper sides of the metal frame, respectively, and the male screws, inserted through the through-holes of the collars or the communication holes of the washers, are floating-inserted through the insertion holes of the metal frame, and screwed in the female screws formed in the water-cooling type heat sink, the attachment error between the ceramic substrate and the water-cooling type heat sink, caused by expansion or shrinkage, is absorbed by the elastic pieces due to the elasticity. Thus, breaking of the ceramic substrate, caused by the change of temperature, can be prevented.

Moreover, in the semiconductor device in which the semiconductor element is mounted onto the circuit pattern, and the power module substrate is joined directly to the water-cooling type heat sink by inserting the male screws through the through-holes and the perforations, inserting the male screws through the through-holes of the collars, or inserting the male screws through the communication holes of the washers, and then, floating-inserting the male screws through the insertion holes of the metal frame, and screwing the male screws in the female screws formed in the water-cooling type heat sink or inserting the male screws through the attachments holes formed to perforate the water-cooling type heat sink and screwing the male screws in the nuts, respectively, the heat transfer route from the semiconductor element mounted on the circuit pattern of the power module substrate joined directly to the water-cooling type heat sink is relatively short, and heat from the semiconductor element can be effectively transferred to the water-cooling type heat sink. As a result, according to the present invention, the heat transfer route from the semiconductor element or the like to the water-cooling type heat sink can be shortened without the ceramic substrate being damaged, so that heat from the semiconductor element can be effectively dissipated.

In the case that the water-cooling type heat sink comprises the heat sink body having the water passage and the heat sink lid capable of sealing the water passage, preferably, the power module substrate is joined directly to the heat sink lid, the frame piece is bonded to the surface of the heat sink lid so as to surround the power module substrate, the terminals and the semiconductor element are connected to each other, and an insulating gel is filled, further, a lid plate is bonded to the upper side of the frame piece, and the heat sink lid is screwed to the heat sink body. Thus, the semiconductor device can be obtained by simple working, that is, by screwing the heat sink lid to the heat sink body.

Obviously, numerous modifications and variations of the present invention are possible in light of the above teachings. It is therefore to be understood that within the scope of the appended claims, the invention may be practiced otherwise than as specifically described herein.

The present Application is based on Japanese Patent Application Serial Nos. 10-267712 (filed on Sep. 22, 1998), 10-267713 (filed on Sep. 22, 1998), 10-352797 (filed on Dec. 11, 1998), 11-029551 (filed on Feb. 8, 1999), 11-138662 (filed on May 19, 1999), and 11-235059 (filed on Aug. 23, 1999), each of which is incorporated herein by reference in their entirety.

What is claimed is:

1. A power module substrate, comprising:
   a ceramic substrate having a circuit pattern formed on a surface thereof, and
   a metal frame provided on a periphery of the ceramic substrate and so structured that the ceramic substrate can be joined to a water-cooling type heat sink;
   wherein the metal frame has a thickness equal to that of the ceramic substrate having the circuit pattern, and is provided with plural perforations formed so as to sandwich the ceramic substrate, and
   metal thin sheets having through-holes in communication with said plural perforations, and containing contacting portions, said contacting portions having an underside contacted to at least a part of a circumferential surface of the ceramic substrate or the circuit pattern disposed on the surface of the metal frame,
   whereby the ceramic substrate having the circuit pattern formed thereon and contacted to the undersides of the contacting portions can be joined to the water-cooling type heat sink by inserting male screws through the through-hole and the perforations, and screwing the male screws in female screws formed in the water-cooling type heat sink or further inserting the male screws through attachment holes formed in the water-cooling type heat sink and screwing the male screws in nuts, respectively.

2. A power module substrate according to claim 1, wherein the ceramic substrate has a thickness of from 0.2 mm to 3.5 mm.

3. A semiconductor device comprising:
   the power module substrate according to claim 1,
   a semiconductor element mounted on the circuit pattern of said power module substrate,
   a frame piece having terminals provided on an inner periphery thereof is bonded to the surface of the power module substrate so as to surround the semiconductor element,
   the terminals and the semiconductor element are connected to each other, and an insulating filler is filled,
   a lid plate is bonded to an upper side of the frame piece,
   the male screws are inserted through the through-holes and the perforations of the metal thin sheet, and the metal frame, and
   the power module substrate is joined directly to the water-cooling type heat sink by screwing the male screws in the female screws formed in the water-cooling type heat sink or further inserting the male screws through the attachment holes formed to perforate the water-cooling type heat sink, and screwing the male screws in the nuts, respectively.

4. A semiconductor device comprising:
   the power module substrate according to claim 1,
   a semiconductor element mounted to the circuit pattern of said power module substrate,
   a water cooling heat sink comprises a heat sink body having a water passage, and a heat sink lid capable of sealing the water passage,
   the male screws are inserted through the through-holes of the metal thin sheet and the perforations of the metal frame of the power module substrate,
   the power module substrate are joined directly to the heat sink lid by screwing the male screws in the female screws formed in the heat sink lid, respectively,
   a frame piece having terminals provided on an inner periphery thereof is bonded to the surface of the heat sink lid so as to surround the power module substrate,
   the terminals are connected to the semiconductor element, and an insulating gel is filled,
   a lid plate is bonded to the upper side of the frame piece, and
   the heat sink lid is screwed to the heat sink body.

5. A semiconductor device, comprising:
   a water cooling heat sink comprises a heat sink body having a water passage, and a heat sink lid capable of sealing the water passage, a semiconductor element is mounted to the circuit pattern of the power module substrate according to claim 1, the male screws are inserted through the through-holes of the metal thin sheet and the perforations of the metal frame of the power module substrate, the power module substrate are joined directly to the heat sink lid by screwing the male screws in the female screws formed in the heat sink lid, respectively, a frame piece having terminals provided on the inner periphery thereof is bonded to the surface of the heat sink lid so as to surround the power module substrate, the terminals are connected to the semiconductor element, and an insulting gel is filled, a lid plate is bonded to the upper side of the frame piece, and the heat sink lid is screwed to the heat sink body.

6. A semiconductor device, comprising:

a water cooling heat sink comprises a heat sink body having a water passage, and a heat sink lid capable of sealing the water passage, a semiconductor element is mounted to the circuit pattern of the power module substrate according to claim 1, the male screws are inserted through the through-holes of the metal thin sheet and the perforations of the metal frame of the power module substrate, the power module substrate are joined directly to the heat sink lid by screwing the male screws in the female screws formed in the heat sink lid, respectively, a frame piece having terminals provided on the inner periphery thereof is bonded to the surface of the heat sink lid so as to surround the power module substrate, the terminals are connected to the semiconductor element, and an insulting gel is filled, a lid plate is bonded to the upper side of the frame piece, and the heat sink lid is screwed to the heat sink body.

7. A semiconductor device, comprising:

a semiconductor element is mounted to the circuit pattern of the power module substrate according to claim 1, a frame piece having terminals provided on the inner periphery thereof is bonded to the surface of the power module substrate so as to surround the semiconductor element, the terminals are connected to the semiconductor element, and an insulating gel is filled, a lid plate is bonded to the upper side of the frame piece, and the power module substrate is bonded directly to the water-cooling type heat sink by means of the male screws.

8. A semiconductor device, comprising:

a semiconductor element is mounted to the circuit pattern of the power module substrate according to claim 1, a frame piece having terminals provided on the inner periphery thereof is bonded to the surface of the power module substrate so as to surround the semiconductor element, the terminals are connected to the semiconductor element, and an insulating gel is filled, a lid plate is bonded to the upper side of the frame piece, and the male screws are inserted through the through-holes of the collars according to claim 11 and the insertion holes of the metal frame, and the power module substrate is joined directly to the water-cooling type heat sink by screwing the male screws in the female screws formed in the water-cooling type heat sink or further inserting through the attachment holes formed so as to perforate the water-cooling type heat sink, and screwing the male screws in the nuts.

9. A semiconductor device, comprising:

a semiconductor element is mounted to the circuit pattern of the power module substrate according to claim 1, a frame piece having terminals provided on the inner periphery thereof is bonded to the surface of the power module substrate so as to surround the semiconductor element, the terminals are connected to the semiconductor element, and an insulating gel is filled, a lid plate is bonded to the upper side of the frame piece, and the male screws are inserted through the communication holes of the washers according to claim 12 and the insertion holes of the metal frame, and the power module substrate is joined directly to the water-cooling type heat sink by screwing the male screws in the female screws formed in the water-cooling type heat sink or further inserting through the attachment holes formed so as to perforate the water-cooling type heat sink, and screwing the male screws in the nuts.

* * * * *